(12) United States Patent
Kitade

(10) Patent No.: US 6,285,222 B1
(45) Date of Patent: Sep. 4, 2001

(54) POWER-ON RESET CIRCUIT, AND SEMICONDUCTOR DEVICE

(75) Inventor: Osamu Kitade, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/226,164

(22) Filed: Jan. 7, 1999

(30) Foreign Application Priority Data

Jul. 17, 1998 (JP) ................................................. 10-202624

(51) Int. Cl.⁷ ....................................................... H03L 7/00
(52) U.S. Cl. ............................. 327/143; 327/198; 327/70
(58) Field of Search .................................. 327/142, 143, 327/198, 68, 70

(56) References Cited

U.S. PATENT DOCUMENTS

| | | | |
|---|---|---|---|
| 4,142,118 | * 2/1979 | Guritz | 327/143 |
| 4,788,462 | 11/1988 | Vesce et al. | 327/142 |
| 5,144,159 | * 9/1992 | Frisch et al. | 327/143 |
| 5,164,613 | * 11/1992 | Mumper et al. | 327/143 |
| 5,614,872 | * 3/1997 | Tagiri | 327/143 |
| 5,910,739 | * 6/1999 | Stanojevic | 327/143 |
| 6,046,615 | * 4/2000 | Chevallier et al. | 327/143 |

FOREIGN PATENT DOCUMENTS

| | | |
|---|---|---|
| 58-3424 | 1/1983 | (JP) . |
| 1-132213 | 5/1989 | (JP) . |
| 4-37309 | 2/1992 | (JP) . |
| 3-48519 | 3/1999 | (JP) . |

* cited by examiner

Primary Examiner—Terry D. Cunningham
Assistant Examiner—Long Nguyen
(74) Attorney, Agent, or Firm—McDermott, Will & Emery

(57) ABSTRACT

A /POR circuit which can detect a power-on of a power supply voltage without fail even in a case where a potential of the power supply rises gently and which produces a /POR signal having a waveform sufficient for initializing internal circuits, as well as a semiconductor device having the /POR circuit. In a power-on reset circuit, a first line potential monitoring circuit and a second line potential monitoring circuit detect a line potential, and there is provided in a /POR signal waveform generation circuit a setting circuit which outputs a pulse signal in response to the results of such detection and operates in response to the pulse signal. Even when the potential of a power-on reset signal rises gently at power-on, the power-on reset signal can be brought to an activation potential without fail, thereby initializing internal circuits.

5 Claims, 20 Drawing Sheets

POWER-ON RESET CIRCUIT, AND SEMICONDUCTOR DEVICE

BACKGROUND OF THE INVENTION

1. Field of the Invention

The present invention relates to a power-on reset circuit which produces a power-on reset signal at the time of power-on for the purpose of resetting individual sections of a semiconductor integrated circuit, as well as to a semiconductor device comprising the power-on reset circuit

2. Description of Related Art

A power-on reset circuit produces, during power-on, a power-on reset signal in response to an increase in the power supply voltage supplied to a semiconductor device for the purpose of initializing predetermined sections of a semiconductor integrated circuit. A conventional power-on reset circuit includes a power-on detection circuit such as that described in Japanese Patent Application Laid-open No. (Hei)5-168151. In such conventional power-on reset circuit, because of any of various technical reasons, such as recent advances in system complication or diversification or a reduction in a system voltage, if a rise in the power supply voltage occurring at power-on becomes very gentle, the power-on reset signal does not reliably assume a desired waveform, so that scheduled resetting or initialization of internal circuits cannot be performed reliably.

FIG. 19 shows the fundamental configuration of a power-on detection circuit described in, e.g., Japanese Patent Application Laid-open No. (Hei) 5-168151. The power-on reset circuit will be described more specifically by reference to this drawing.

FIG. 20 shows variations in the potential of individual nodes of a power-on reset circuit (hereinafter referred to simply as a "/POR circuit") in a case where a rise in a power supply voltage occurring at power-on is gentle such that the voltage takes about 5 ms to rise from the ground potential (0V) to the power supply voltage or line potential (5V).

In FIG. 19, reference numerals 1c, 2c, 3c, and 4c designate capacitors. Particularly, reference numeral 1c designates a capacitor for monitoring a rise in the line potential supply. Reference numerals i1, i2, i3, i4, and i5 designate inverter circuits, and a latch circuit 10 includes inverters i1 and i2. Reference numeral 20 designates a discharge circuit for discharging the electric charges stored in the capacitor 1c. The discharge circuit 20 comprises the inverter i5, a discharge transistor 1, a diode-connected transistor 2, and an N-channel transistor 3 connected between the ground potential and the gate of the discharge transistor 1. The inverter i1 comprises an N-channel transistor in and a P-channel transistor 1p; the inverter i2 comprises an N-channel transistor 2n and a P-channel transistor 2p; the inverter i3 comprises an N-channel transistor 3n and a P-channel transistor 3p; the inverter i4 comprises an N-channel transistor 4n and a P-channel transistor 4p; and the inverter i5 comprises an N-channel transistor 5n and a P-channel transistor 5p.

In FIG. 19, the output nodes of the individual inverters i1, i2, i3, i4, and is are taken as n1, n2, n3, n4, and n5, respectively, and the gate node of the discharge transistor 1 is taken as n20.

The operation of the power-on detection circuit will now be described. In FIG. 20, power is switched on at time t0, and the line potential gradually rises. Correspondingly, the potential of the output nodes of the individual inverters i1 to i5 and the potential of the /POR signal start increasing so as to follow a rise in the line potential. In this state, there is subtle continuity between the N-channel and P-channel transistors of each inverter, and a pass-through current flows through each inverter. The output potential may be at any potential level between the ground potential and the line potential and is very unstable. Under the influence of the inverters having their nodes connected together, the capacitors, and the load capacity of wiring patterns, a small time lag and a small potential difference arises in the output nodes. However, the potential of the output nodes rises so as to substantially follow the line potential. The monitoring capacitor 1c shown in FIG. 19 is comparatively higher in capacitance than the potential stabilizing capacitors 2c, 3c, and 4c. For this reason, when there is a lag in a rise in line potential, a great lag arises in a rise in the potential of the node n1, so that the charging of the node n2 is started by way of the P-channel transistor 2p of the inverter i2. Since the /POR signal line is routed to the individual internal circuits, the potential of the node n4 where the /POR signal appears is susceptible to wiring capacitance and resistance greater than those to which the other nodes are susceptible. Therefore, the /POR signal follows a rise in the line potential at a rate comparatively slower than that at which the other nodes follow.

At time t1, the potential of the /POR signal exceeds the threshold voltage of the N-channel transistor 3, thereby bringing the N-channel transistor 3 into conduction. The node n2 is brought to the ground potential, and the discharge transistor 1 is brought into a non-conducting state.

At time t2, the N-channel transistor in of the inverter i1 included in the latch circuit 10 is brought into conduction by means of a subtle balance of increase ratio between the potential of the node n1 and the potential of the node n2, thereby bringing the P-channel transistor 1p into a non-conducting state. Further, the N-channel transistor 2n of the inverter i2 is brought into a non-conducting state, thereby bringing the P-channel transistor 2p into conduction. Subsequently, regardless of the value of a rise in the line potential, the potential of the node n1 remains at an intermediate potential level and does not rise, because the N-channel transistor In of the inverter i1 is in conduction. In other words, the electric charges-which is being stored in the node n1 as a result of a rise in the line potential-is simultaneously discharged by means of the transistor 1n. As a result, the line potential is not monitored at all. In contrast, the potential of the node n2 follows a rise in the line potential by way of the P-channel transistor 2p. In FIG. 20, since the line potential finally achieves 5V, the intermediate potential assumes a value of 2.5V. However, it goes without saying that the intermediate potential may be lower or higher than 2.5V, depending on the size and configuration of transistors and capacitors or on wiring patterns.

At time t3, the N-channel transistor 3n of the inverter i3 is brought into conduction because of a rise in the potential of the node n2, thereby bringing the P-channel transistor 3p into a non-conducting state. As a result, the discharging of the electric charge stored in the node n3 is started, and the potential of the node n3 is gradually brought to the ground potential. In response to the gradual change in the potential, the N-channel transistor 4n of the inverter i4 is brought to a non-conducting state, and the P-channel transistor 4p of the same is brought to conduction. Accordingly, the /POR signal rises further so as to follow a rise in the line potential without being brought to the ground potential and is determined so as to equal the final power potential. Although the /POR signal is originally expected to remain in the ground potential until time t4 at which the power rises to 5V, the signal fails to satisfy the expected state.

As mentioned above, in the conventional /POR circuit, in a case where the potential of the power supply voltage at power-on is gentle, the latch circuits in the /POR circuit are held in a false state, thereby discharging electric charge which is being stored into a capacitor for monitoring a rise in line potential. As a result, the monitoring capacitor fails to fulfill its performance correctly, thereby hindering reliable detection of a power-on of a power supply voltage.

In such a case, the power-on of a power supply voltage cannot be detected, and the /POR signal assumes a waveform insufficient for reliable initializing the internal circuits.

Further, since the power-on of a power supply voltage is detected by means of only the monitoring capacitor, there can be detected only a rise in the potential of a portion of a power supply line. If the function of the monitoring capacitor becomes paralyzed or deteriorated because of process problems, the power-on of a power supply voltage cannot be detected correctly.

SUMMARY OF THE INVENTION

The present invention has been conceived to solve the foregoing problems of the conventional power-on detection circuit, and the object of the present invention is to provide an /POR circuit which, in the case of a gentle rise in the potential of the power supply at power-on, although latch circuits in the /POR circuit is held in a false state and a monitoring capacitor fails to fulfill its function, is capable of reliably detecting the power-on of a power supply voltage and produces a /POR signal having a potential sufficient for initializing internal circuits.

Another object of the present invention is to provide a /POR circuit capable of reliably detecting the power-on of a power supply voltage by means of a plurality of different power-potential monitoring circuits.

Still another object of the present invention is to provide a /POR circuit which, in a case where there is a gentle rise in the potential of the power supply at power-on, is capable of reliably detecting the power-on of a power supply voltage and maintains an activation potential enough to initialize internal circuits and produces a /POR signal which is brought to an inactivation potential without fail after elapse of a predetermined period of time.

Yet another object of the present invention is to provide a semiconductor device which has internal circuits and /POR circuits, both being integrated on a single chip, and various power lines, in consideration of a difference in potential rise rate among the capacitance and resistance values of the power lines, even when there is a gentle rise in the potential of the power supply at the time of power-on, can produce a potential sufficient for initializing internal circuits without fail, i.e., a /POR signal held in a ground potential.

According to a first aspect of the present invention, there is provided a power-on reset circuit, which comprises a line potential detection circuit, a pulse signal generation circuit and a power-on reset circuit. The line potential detection circuit has a first line potential monitoring circuit, a second line potential monitoring circuit and a comparison circuit. The first line potential monitoring circuit includes a first voltage dividing circuit connected between a power supply node and a ground node and outputs a first monitor voltage. The second line potential monitoring circuit includes a second voltage-dividing circuit connected between a power supply node and a ground node and outputs a second monitor voltage. The comparison circuit compares the first monitor voltage with the second monitor voltage. The pulse signal generation circuit outputs a first pulse signal in response to the detection results output from the line potential detection circuit. The power-on reset circuit has a setting circuit which brings a power-on reset signal to a set level in response to the first pulse signal and produces the power-on reset signal upon sensing a rise in the potential of the power supply.

In the power-on reset circuit, the first monitor voltage may rise faster than the second monitor voltage when there is a rise in the potential of the power supply.

Here, the power-on reset circuit may further comprise a delay circuit which receives the first pulse signal output from the pulse signal generation circuit and which outputs a second pulse signal by delaying the first pulse signal by a predetermined period of time; and wherein the power-on reset signal waveform generation circuit may further include a reset circuit which brings the power-on reset signal to a deactivation potential in response to the second pulse signal.

Here, the power-on reset circuit may further comprise a timer circuit which receives the first pulse signal from the pulse signal generation circuit and measures a predetermined period of time in response to the first pulse signal; and wherein the power-on reset signal waveform generation circuit may further include a reset circuit which brings the power-on reset signal to the deactivation potential in response to a signal output from the timer circuit.

In the power-on reset circuit, the timer circuit may comprise an oscillation circuit which starts oscillation in response to the first pulse signal and a counter circuit which performs a count-up operation in response to an oscillating signal from the oscillation circuit.

In the power-on reset circuit, the setting circuit may be connected between a power-on reset signal output node and a predetermined node which is imparted with a potential corresponding to a set level of the power-on reset signal, and the setting circuit may include a transistor which is brought into conduction in response to the first pulse signal.

According to a second aspect of the present invention, there is provided a power-on reset circuit, which comprises a line potential detection circuit, a pulse signal generation circuit and a power-on reset signal waveform generation circuit. The line potential detection circuit detects a rise in a potential of a power supply in response to first and second monitor voltages respectively output in response to a rise in the potential of the power supply. The pulse signal generation circuit produces a pulse signal in response to first and second detection results output from the line potential detection circuit, and the power-on reset signal waveform generation circuit has a setting circuit for bringing a power-on reset signal to a set level in response to the pulse signal and produces the power-on reset signal by sensing a rise in the potential of the power supply.

In the power-on reset circuit, the first and second monitor voltages may be output in response to a rise in the potential of power supply lines having different time constants.

According to a third aspect of the present invention, there is provided a semiconductor device, which comprises internal circuits and a power-on reset circuit. The internal circuits are initialized in response to a power-on reset signal. The power-on reset circuit includes a line potential detection circuit, a pulse signal generation circuit, a setting circuit and a power-on reset signal waveform generation circuit. The line potential detection circuit detects a rise in a potential of a power supply in response to first and second monitor voltages output respectively in response to the rise in the potential of the power supply. The pulse signal generation circuit produces pulse signals in response to first and second detection results output from the line potential detection circuit. The setting circuit sets the power-on reset signal to a set level in response to the pulse signal. The power-on reset signal waveform generation circuit produces the power-on reset signal by sensing a rise in the potential of the power supply. The internal circuits and the power-on reset circuit are integrated into a single chip.

In the semiconductor device, the first and second monitor voltages may be output in response to a rise in the potentials of power supply lines having different time constants.

In the semiconductor device, the setting circuit may be connected between a power-on reset signal output node and a predetermined node which is imparted with a potential corresponding to the set level of the power-on reset signal, and the setting circuit may include a transistor which is brought into conduction in response to the pulse signals.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
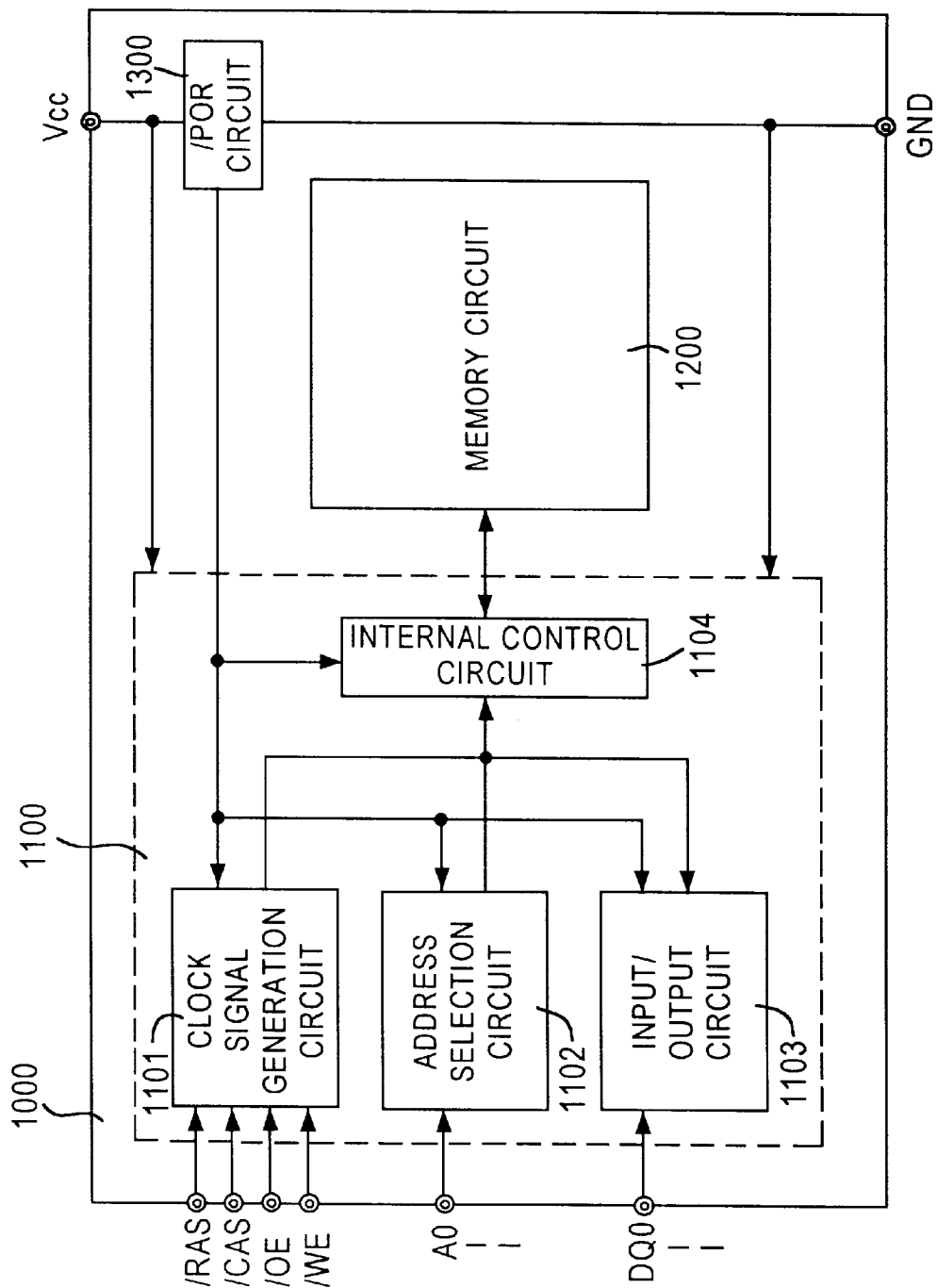
FIG. 1 is a block diagram showing a configuration of DRAM (Dynamic Random Access Memory) according to embodiment 1 of the present invention.

Embodiments of the present invention will be described below with reference to the accompanying drawings. It is noted that the same reference symbols in the drawings denote the same or corresponding components.

Embodiment 1

FIG. 1 is a block diagram showing DRAM (Dynamic Random Access Memory) using a power-on reset circuit according to embodiment 1 of the present invention. In the drawing, reference numeral 1000 designates DRAM; reference symbol Vcc designates a power supply terminal; GND designates a ground terminal; /RAS designates an /RAS terminal which receives a row address strobe signal for the purpose of acquiring an address in a row direction of a memory; /CAS designates an /CAS terminal which receives a column address strobe signal for the purpose of acquiring an address in a columnar direction of a memory; /OE designates a /OE terminal which receives an output enable signal for output control purposes; and /WE designates a /WE terminal which receives a write enable signal for write control purposes. AO designates an address terminal which receives an address signal; and DQ0 designates a data input/output terminal which receives or outputs input/output data. The number of these elements is determined in consideration of a memory capacity of the DRAM and bit configuration.

The DRAM 1000 comprises an internal circuit 1100 which determines, instructs, and controls various internal operations in accordance with signals input from individual terminals; a memory circuit 1200 having a plurality of memory cells for storing data; and a power-on reset circuit 1300 (hereinafter referred to as a "/POR circuit") which, upon receipt of a line potential and a ground potential, produces a power-on reset signal (hereinafter referred to as a "/POR signal") for initializing the internal circuit 1100 at the time of supply or power-on of a power supply voltage.

The internal circuit 1100 comprises a clock signal generation circuit 1101 which, upon receipt of signals from /RAS, /CAS, /OE, and /WE terminals, produces various types of clock signals for the purposes of controlling various operations within the DRAM; an address selection circuit 1102 which, upon receipt of an address signal, selects one of the memory cells provided in the memory circuit 1200; an input/output circuit 1103 which acquires data input from data input/output terminals at the time of writing of data and which outputs from the data input/output terminals the data read from the memory circuit 1200; and an internal control circuit 1104 which writes data into or reads data from the memory circuit by control of the signals or data from or into the foregoing individual circuits.

Figure 2:
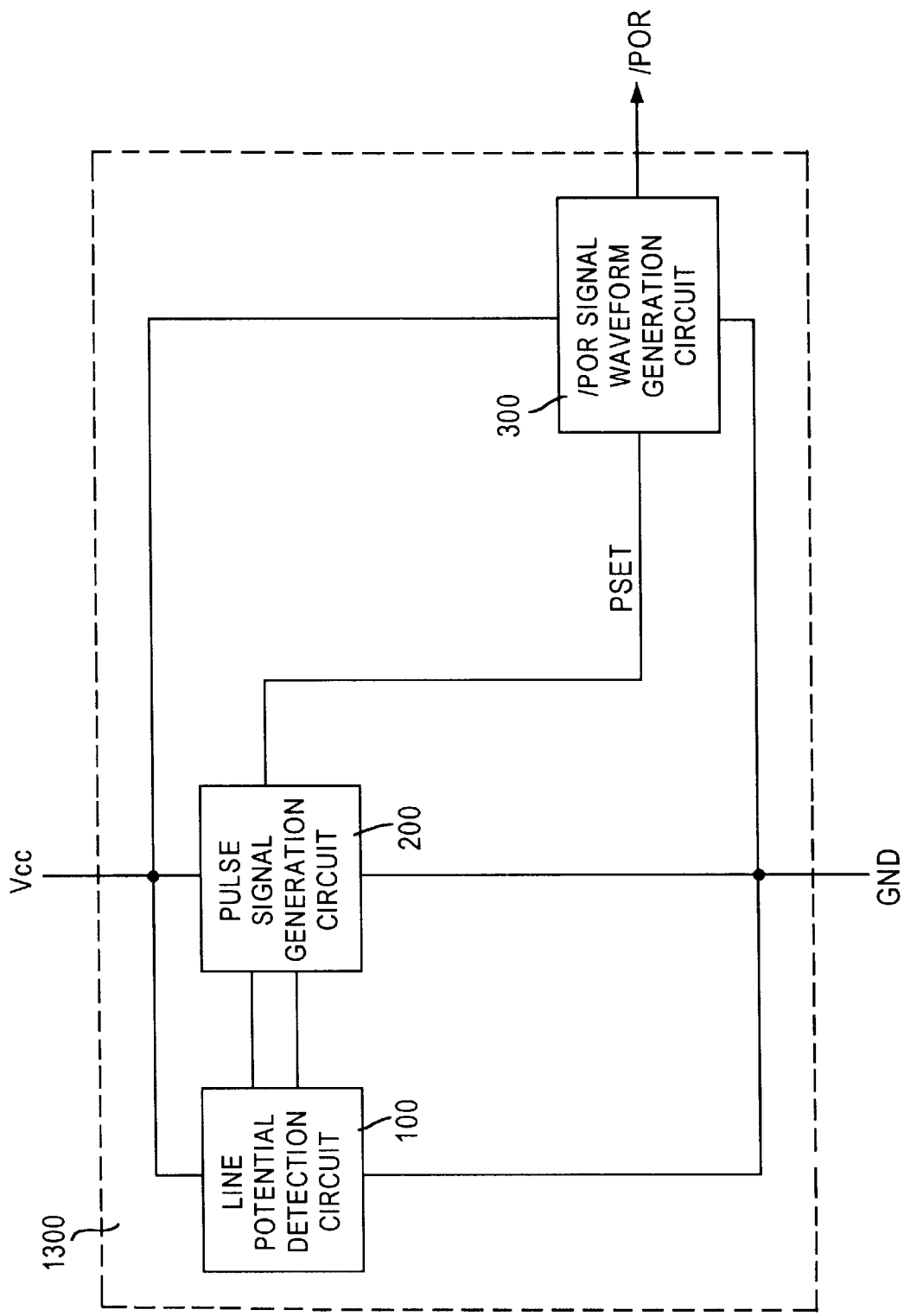
FIG. 2 is a block diagram showing a configuration of the /POR circuit in the DRAM shown in FIG. 1.

FIG. 2 is a block diagram showing a configuration of the /POR circuit 1300 shown in FIG. 1. The /POR circuit 1300 comprises a line potential detection circuit 100 for detecting a rise in the line potential; a pulse signal generation circuit 200 which produces a pulse signal upon receipt of a detection result, i.e., an output from the line potential detection circuit 100; and an /POR signal waveform generation circuit 300 which brings the /POR signal to an activation potential, i.e., the ground potential according to the embodiment 2, upon receipt of a pulse signal output from the pulse signal generation circuit 200.

The /POR signal is in an activated state of a period of time over which the ground potential is maintained after power has been switched on, and the internal circuit is subjected to initial setting during this period. After the lapse of a predetermined period of time, the /POR signal is brought to a line potential and become inactivated, thereby completing initial setting of the internal circuit. In the following description, the potential at which the /POR signal is activated is taken as a set level, and the potential at which the /POR signal is deactivated is taken as a reset level.

Hereinafter, Vcc and GND provided in the drawings denote a power supply node and a ground node, respectively.

Figure 3:
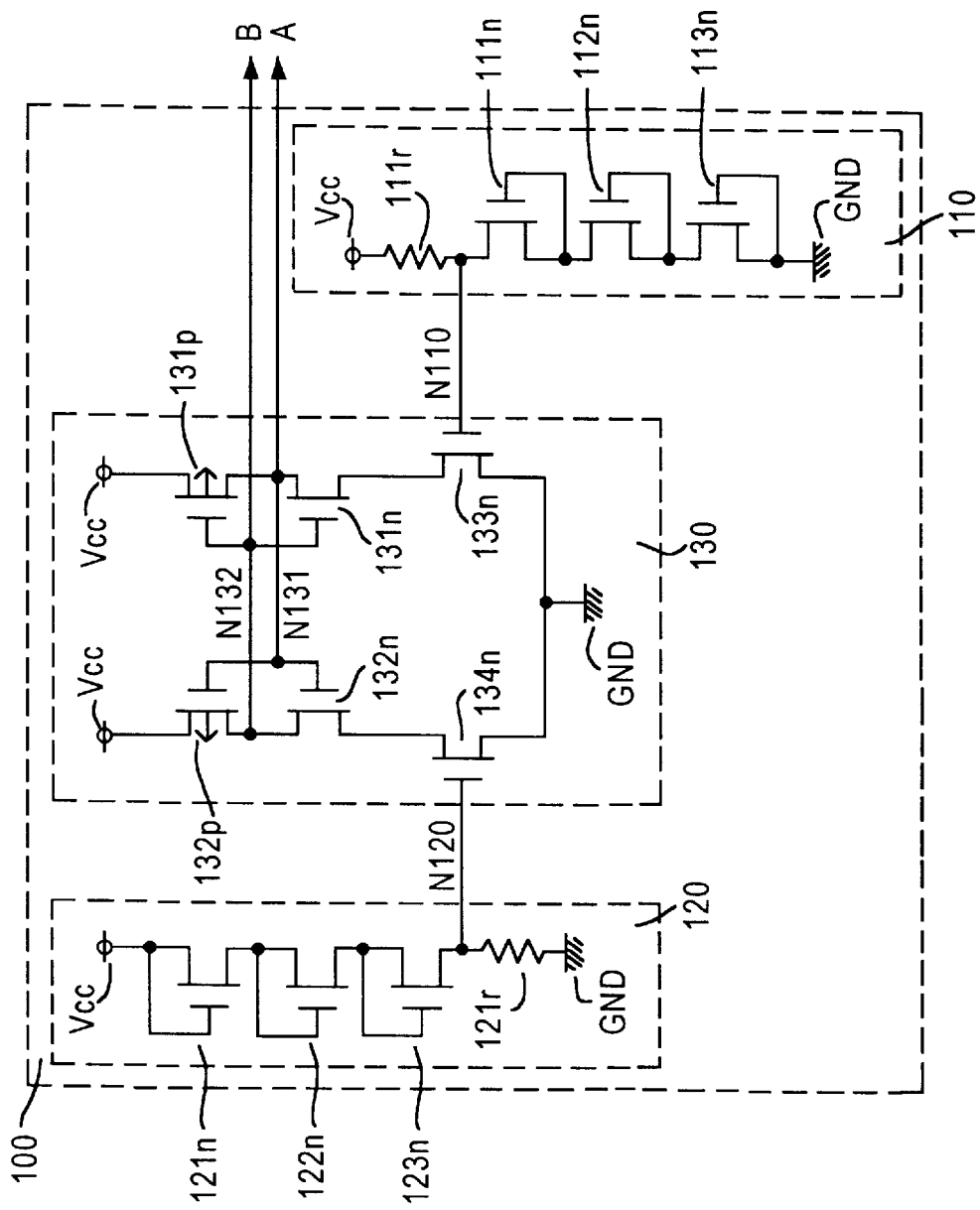
FIG. 3 is a circuit diagram showing a configuration of a line potential detection circuit in the /POR circuit shown in FIG. 2.

FIG. 3 is a circuit diagram showing a specific example of the line potential detection circuit 100 shown in FIG. 2. The line potential detection circuit 100 comprises a first line potential monitoring circuit 110, a second line potential monitoring circuit 120, and a comparison circuit 130 which compares a first monitor voltage output from the first line potential monitoring circuit 110 with a second monitor voltage output from the second line potential monitoring circuit 120 and outputs the results of such comparison.

The first line potential monitoring circuit 110 comprises a resistive element 11r which is connected in series between the power supply node Vcc and the ground node GND and a potential divider circuit which has a diode-connected N-channel transistors 111n, 112n, and 113n, and outputs the first monitor voltage from a connection node NI10 disposed between the resistive element 111r and the N-channel transistor 111n. The second line potential monitoring circuit 120 comprises a potential divider circuit which has a diode-connected N-channel transistors 121n, 122n, and 123n and a resistive element 121r connected in series between the power supply node Vcc and the ground node GND. The second line potential monitoring circuit 120 outputs the second monitor voltage from a connection node N120 disposed between the resistive element 121r and the N-channel transistor 123n.

The resistive element 121r has a comparatively high resistance value (several hundreds of kilo ohms) at which a final potential of the second monitor voltage, i.e., the line potential which assumes a peak and the second monitor voltage substantially assumes a Vcc-3Vth. In contrast, the resistive element 111r assumes a comparatively low resistance value which is lower than that of the resistive element 121r (approximately half the resistance value of the resistive element 121r).

The comparison circuit 130 comprises an N-channel transistor 133n which receives at its gate the first monitor voltage and which has its source connected to the ground node; N-channel and P-channel transistors 131n and 131p which are connected in series between the drain of the N-channel transistor 133n and the power supply node Vcc and which output a first comparison result A from a connection node N131; an N-channel transistor 134n which receives at its gate the second monitor voltage and which has its source connected to the ground node; and N-channel and P-channel transistors 132n and 132p which are connected in series between the drain of the N-channel transistor 134n and the power supply node Vcc and which output a second comparison result B from a connection node N132.

Figure 4:
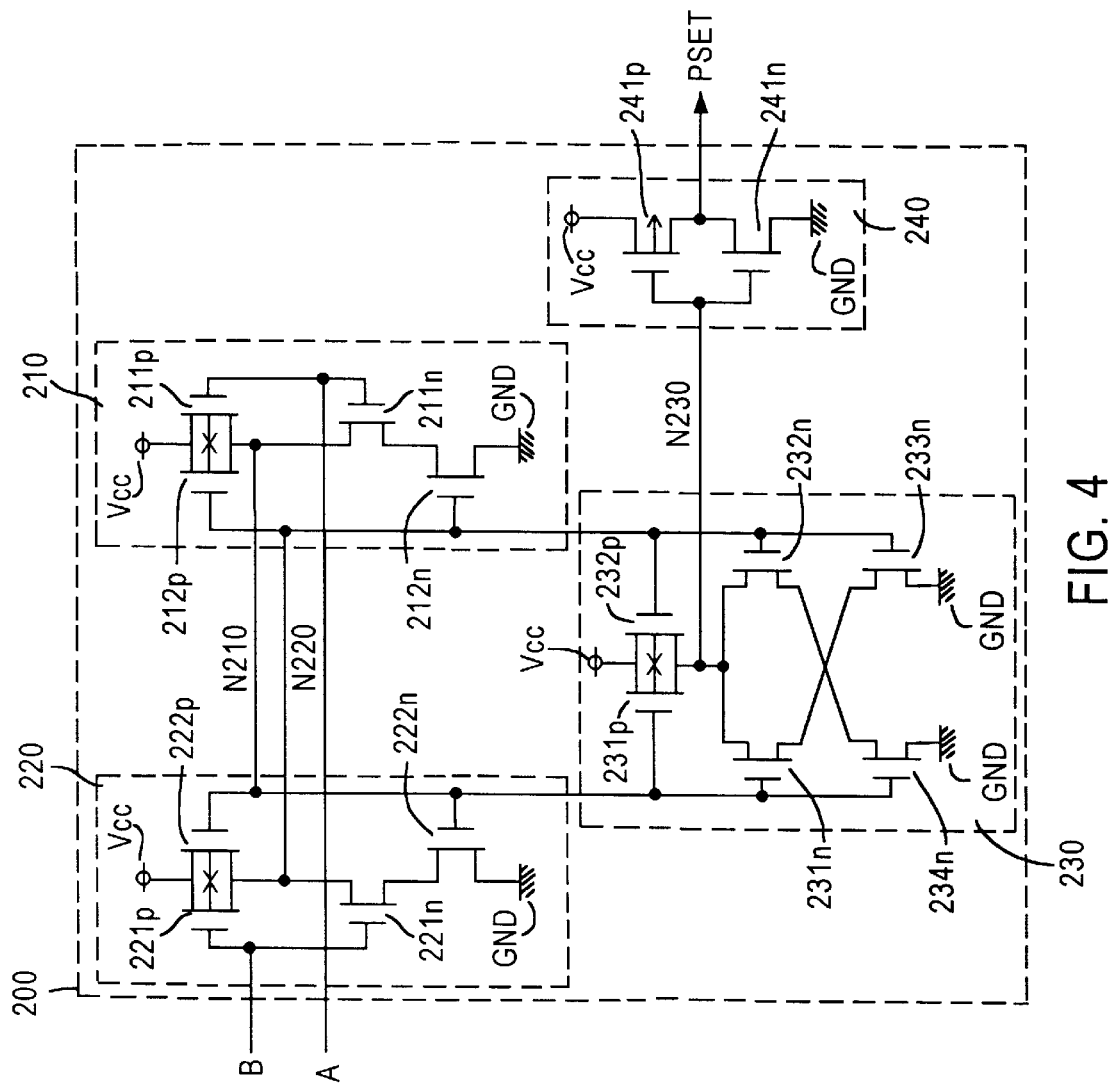
FIG. 4 is a circuit diagram showing a configuration of a pulse signal generation circuit in the /POR circuit shown in FIG. 2.

FIG. 4 is a circuit diagram showing a specific example of the pulse signal generation circuit 200 shown in FIG. 2. The pulse signal generation circuit 200 comprises 2-input NAND gates 210 and 220, wherein the NAND gate 210 receives an output from the NAND gate 220 and the first comparison result A output from the line potential detection circuit 100, and wherein the NAND gate 220 receives an output from the NAND gate 210 and the second comparison result B output from the line potential detection circuit 100; a pulse signal generation circuit 230 which produces a pulse signal upon receipt of signals output from the NAND gates 210 and 220; and an inverter circuit 240 which shapes the waveform of the pulse signal output from the pulse generation circuit 230 and drives a PSET signal.

The NAND gate 210 comprises N-channel and P-channel transistors 211n and 211p connected at their gates to the node N131 of the line potential detection circuit 100 to which the comparison result A is output; and N-channel and P-channel transistors 212n and 212p whose gates are connected to an output node N220 of the NAND gate 220.

The NAND gate 220 comprises N-channel and P-channel transistors 221n and 221p connected at their gates to the node N132 of the line potential detection circuit 100 to which the comparison result B is output; and N-channel and P-channel transistors 222n and 222p whose gates are connected to an output node N210 of the NAND gate 210.

The P-channel transistor 221p included in the NAND gate 220 has a channel width wider than that of the P-channel transistor 211p included in the NAND gate 210. When a ground potential is input, the P-channel transistor 221p permits flow of a strong electric current to the output node N220 from the power supply node Vcc. More specifically, in response to the comparison results A and B, the NAND gate 220 can easily output a line potential signal, and the NAND gate 210 can easily output a ground potential signal.

The pulse generation circuit 230 comprises P-channel and N-channel transistors 231p and 231n which are connected in series between the power supply node Vcc and the ground node GND and which are connected at their gates to the output node N210 of the NAND gate 210; an N-channel transistor 233n whose gate is connected to the output node N220 of the NAND gate 220; P-channel and N-channel transistors 232p and 232n which are connected in series between the power supply node Vcc and the ground node GND and which are connected at their gates to the output node N220 of the NAND gate 220; and an N-channel transistor 234n whose gate is connected to the output node N210 of the NAND gate 210. A connection node of a transistor pair, i.e., the P-channel transistor 231p and the N-channel transistor 231n, is connected to another connection node of another transistor pair, i.e., the P-channel transistor 232p and the N-channel transistor 232n, whereby the pulse signal generation circuit 230 outputs a signal from the connection nodes.

The waveform shaping inverter 240 receives the signal output from the pulse signal generation circuit 230 and includes P-channel and N-channel transistors 241p and 241n which receive at their gates the signal output. The waveform of the pulse signal is shaped by means of the waveform shaping inverter 240, so that a pulse signal PSET is output from the pulse signal generation circuit 200.

Figure 5:
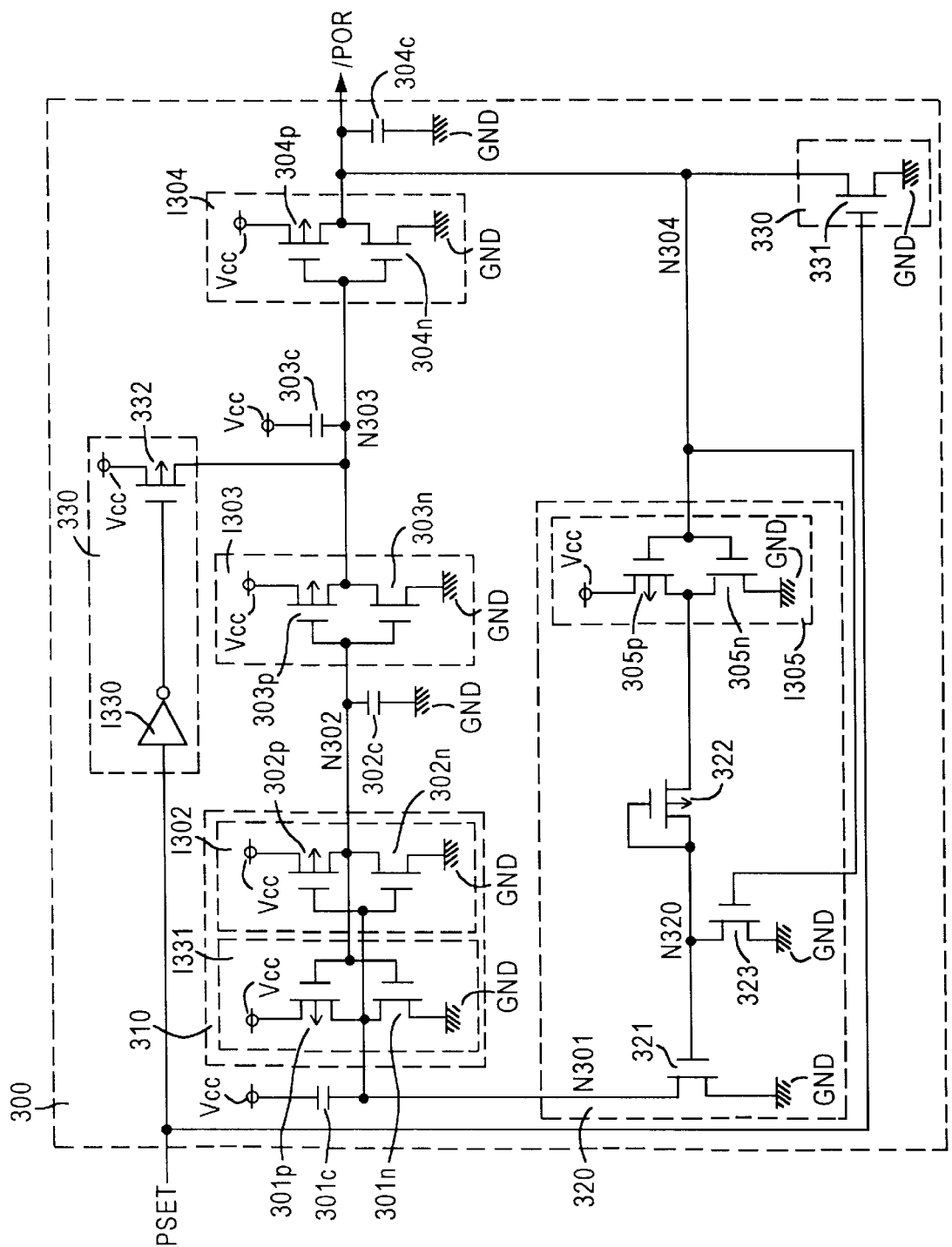
FIG. 5 is a circuit diagram showing a configuration of a /POR signal waveform generation circuit in the /POR circuit shown in FIG. 2.

FIG. 5 is a circuit diagram showing a specific example of the /POR signal waveform generation circuit 300 provided in FIG. 2. The /POR signal waveform generation circuit 300 is a sensing circuit for monitoring a rise in the line potential. The /POR signal waveform generation circuit 300 comprises a capacitor 301c having one end connected to the power supply node Vcc; a latch circuit 310 including inverters 1301 and 1302 which receive an input signal from the node N301 connected to the other end of the capacitor 301c; a capacitor 302c connected between an output node N302 of the latch circuit 310 and the ground node GND; an inverter I303 which receives an input signal from the node N302; a capacitor 303c connected between the output node N303 and the power supply node Vcc; an inverter I304 which receives a signal from the node N303 and outputs a /POR signal; a capacitor 304c connected between the node N304 from which the /POR signal is output and the ground node GND; a discharge circuit 320 which receives a signal from the /POR signal output node N304 and discharges the electric charge stored in the node N301; and a setting circuit 330 which brings the /POR signal to the ground potential in response to the pulse signal PSET output from the pulse signal generation circuit 200.

The capacitors 302c, 303c, and 304c are supplemental in nature and are provided in order to stabilize the potentials of the individual nodes. Then, the capacitor 301c provided for the purpose of sensing a power supply voltage has a capacitance which is higher than that of the capacitors 302c, 303c, and 304c connected to the individual nodes.

The discharge circuit 320 comprises an inverter I305 which receives the /POR signal output from the node N304; an N-channel discharge transistor 321 which is connected between the node N301 and the ground node GND, which discharges the electric charges stored in the node N301, and which brings the potential of the node N301 to the ground potential; a diode-connected P-channel transistor 322 which is connected between an output node of the inverter I305 and the gate of the N-channel discharge transistor 321; and an N-channel transistor 323 which is connected between the gate of the N-channel transistor 321 and the ground node GND and which receives at its gate the /POR signal. The setting circuit 330 comprises an N-channel transistor 331 which is connected between the /POR signal output node N304 and the ground node GND and which receives at its gate the pulse signal PSET output from the pulse signal generation circuit 200; an inverter I330 which inverts the pulse signal PSET output from the pulse signal generation circuit 200; and a P-channel transistor 332 which is connected between the node N303 and the power supply node and which receives at its gate an inverted signal of the pulse signal PSET output from the inverter I330.

The inverter I301 comprises a P-channel transistor 301p and an N-channel transistor 301n; the inverter I302 comprises a P-channel transistor 302p and an N-channel transistor 302n; the inverter I303 comprises a P-channel transistor 303p and an N-channel transistor 303n; the inverter I304 comprises a P-channel transistor 304p and an N-channel transistor 304n; and the inverter I305 comprises a P-channel transistor 305p and an N-channel transistor 305n.

Figure 6:
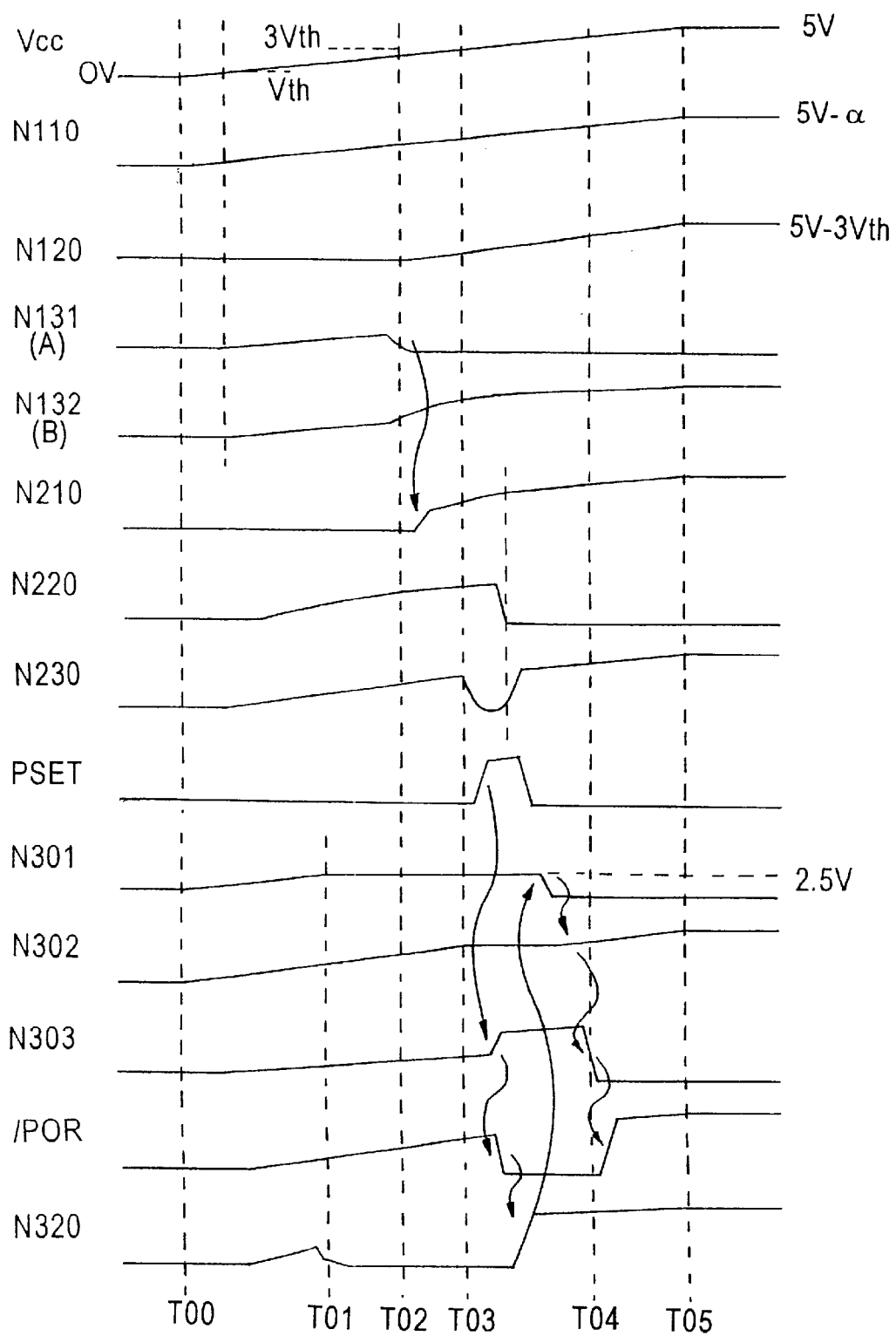
FIG. 6 is a timing chart showing operations in a case of a gentle rise of line potential in the /POR circuit shown in FIG. 2.

The operation of the power-on reset circuit will now be described. FIG. 6 is a timing chart showing the operations of the power-on reset circuit according to embodiment 1. The drawing shows variations in the potentials of individual nodes of the /POR circuit in a case where at power-on there is a gentle rise in the potential of a power supply voltage such that the voltage takes about 5 ms to rise from the ground potential (0V) to the line potential (5V).

When the line potential starts to rise gradually at time T00, an electric current flows by way of the resistive element 111r of the first line potential monitor circuit 110 shown in FIG. 1. As a result, the potential of the first monitor voltage, i.e., the potential of the node N10, starts to rise. In contrast, in the second line potential monitoring circuit 120, the three diode-connected N-channel transistors 121n, 122n, and 123n are connected in series between the power supply potential node Vcc and the node N120 which outputs the second monitor voltage, so the potential of the node N120 is momentarily maintained at the ground potential. When the line potential becomes substantially equal to or greater than the threshold values of the P-channel transistors 131p and 132p, the potentials of the nodes N131 and N132 which output the comparison results A and B start to rise.

The NAND gates 210 and 220 of the pulse signal generation circuit 200 shown in FIG. 4 receive the comparison results A and B from the comparison circuit 130 included in the line potential detection circuit 100. At this time, the channel width of the P-channel transistor 221p included in the NAND gate 220 is set so as to become greater than that of the P-channel transistor 211p included in the NAND gate 210 in advance. Accordingly, if there is a certain degree of rise in the line potential, the P-channel transistor 221p is brought into conduction prior to the P-channel transistor 211p. Therefore, the potential of the output node N220 of the NAND gate 220 equals the line potential at that time. The N-channel transistor 212n of the NAND gate 210 receives the potential of the node N220 and is brought to conduction. Further, because of a rise in the potential of the node N131 due to the comparison result A output from the comparison circuit 130, the N-channel transistor 211n is also brought into conduction, thereby bringing the output node N210 of the NAND gate 210 to the ground potential. The pulse signal generation circuit 230 outputs from the node N230 a voltage equal to the line potential, because the P-channel transistor 231 having the gate connected to the output node N210 of the NAND gate 210 is brought into conduction. The thus-output voltage is inverted by means of the waveform shaping inverter 240, whereby the pulse signal PSET output from the pulse signal generation circuit 200 is brought to the ground potential.

In the /POR circuit 300 shown in FIG. 5, the line voltage sensing capacitor 301c is arranged so as to monitor a rise in the line potential, and hence the potential of the node N301 rises so as to follow a rise in the line potential. However, since the capacitor 302c is smaller than the capacitor 301c, the capacitor 302c delivers a limited performance in maintaining the node N302 at the ground potential. Under unstable conditions of both the N-channel transistor 302n and the P-channel transistor 302p being in conduction, the potential of the node N302 rises so as to follow a rise in the line potential. The potential of the node N303 rises so as to follow a rise in the line potential similarly. Further, since the /POR signal line is routed to the individual internal circuits, the node N304 which outputs the /POR signal is susceptible to line capacitance and resistance greater than those to which the other nodes are susceptible. For this reason, the potential of the node N304 follows a rise in the line potential more slowly than do the potentials of the nodes N301, N302, and N303. The node N320 of the discharge circuit 320 become recharged by way of the P-channel transistor 305p included in the inverter I305, which, along with the remaining inverter, is unstable. Consequently, although the potential of the node N320 rises so as to follow a rise in the line potential, the N-channel transistor 323 is brought into conduction when the potential of the /POR signal, i.e., the potential of the node N304, exceeds the threshold voltage of the N-channel transistor 323. Accordingly, the node N320 is brought to the ground potential.

At time T01, because of a balance in potential rise rate between the node N301 and the node N302, the N-channel transistor 301n of the inverter I301 included in the same latch circuit is brought into conduction prior to the inverter I302 included in the latch circuit 310, and the P-channel transistor 301p is brought into a non-conducting state. For these reasons, regardless of the node N301 being recharged as a result of a rise in the line potential, the potential of the node N301 remains in an intermediate potential, because the N-channel transistor 301n of the inverter I301 is in conduction. In contrast, the P-channel transistor 302p included in the inverter I302 is brought into stronger conduction in association with a rise in the line potential, because there is no rise in the potential of the gate node N301. Thus, the potential of the node N302 rises so as to follow the line potential.

In the line potential detection circuit 100 at time T02, when the line potential exceeds the sum of the threshold voltages of the N-channel transistors 121n, 121n, and 123n of the second line potential monitoring circuit 120, the potential of the output node N120 of the second line potential monitoring circuit 120 starts to rise. At this time, since the potential of the output node N110 of the first line potential monitoring circuit 110 has already risen to a certain level, an electric current stronger than that flowing through the N-channel transistor 134 which receives at its gate the voltage output from the node N120, i.e., the second monitor voltage, flows through the N-channel transistor 133 which receives at its gate the voltage output from the node N110, i.e., the first monitor voltage.

Therefore, the ground potential is output to the node N131 as the comparison result A produced by the comparison circuit 130, and the line potential is output to the node N132 as the comparison result B.

In the pulse signal generation circuit 200, when the potential of the node N131 is brought to the ground potential as the comparison result A of the line potential detection circuit 100, the P-channel transistor 211p of the NAND gate 210 is brought into conduction, and the output node N210 of the NAND gate 210 is brought to the line potential. At this time, the potential of the node N132 is at the line potential as the remaining comparison result B of the line potential detection circuit 100. Therefore, the N-channel transistor 221n included in the NAND gate 220 may be brought into conduction. However, the P-channel transistor 221p included in the NAND gate 220 has a comparatively large channel width, and the line potential is also in the course of rising. Accordingly, the potential of the output node N220 of the NAND gate 220 does not change and is maintained at substantially the same level as the line potential until the line potential rises further. The reason for this is that the channel width of the P-channel transistor 221p included in the NAND gate 220 is set in advance so as to become greater than that of the P-channel transistor 211p included in the NAND gate 210, thereby setting the logical threshold value of the NAND gate 220 so as to become higher than the potential of the node N132.

At time T03, there are brought into conduction all the N-channel transistors 231n, 232n, 233n, and 234n which are included in the pulse signal generation circuit 230 and which receive at their gates the potential of the output node N210 of the NAND gate 210 and the potential of the output node N220 of the NAND gate 220 in the pulse signal generation circuit 200, the potentials having risen so as to follow a rise in the line potential up to now. Therefore, the output gate node N230 of the pulse signal generation circuit 230 is brought to the ground potential, and the signal PSET output from the inverter 240 is brought to the line potential. Subsequently, when the potential of the node N132—which outputs the comparison result B produced by the line potential detection circuit 100—rises further, the conductivity of the N-channel transistors 221n and 222n included in the NAND gate 220 becomes higher, thereby bringing the potential of the output node N220 of the NAND gate 220 to the ground potential. As a result, the P-channel transistor 232p included in the pulse signal generation circuit 230 is brought into conduction, thereby bringing the potential of the node N230 to the line potential. The signal output from the pulse signal generation circuit 230 is inverted by means of the waveform shaping inverter 240, so that the pulse signal PSET is brought to the ground potential. Through the foregoing operations, the pulse signal PSET is output.

In response to the pulse signal PSET output from the pulse signal generation circuit 200, the N-channel transistor 331 of the setting circuit 330 included in the /POR signal waveform generation circuit 300 is brought into conduction. Simultaneously, the inverter I330 inverts the pulse signal PSET, and the P-channel transistor 332 of the setting circuit 330 is brought into conduction in response to the inverted pulse signal. As a result of the N-channel transistor being brought into conduction, the /POR signal is brought to a setting level, i.e., a ground potential. As a result of the P-channel transistor 332 being brought into conduction, the potential of the node N303 is brought to the line potential, and the logic level of the node N303 is inverted by means of the inverter I304, whereby the /POR signal is brought to the ground potential. The P-channel transistor 332 of the setting circuit 330 is provided in order to make the /POR signal waveform generation circuit more stable when the /POR signal is brought to the ground potential by bringing the potential of the node N303 to the ground potential. The potential of the output node of the inverter I305 provided in the discharge circuit 320 is brought to the line potential in response to variations in the potentials of the nodes N304 and N303. By means of the diode-connected P-channel transistor 322, a potential-which is lower than the line potential by an amount corresponding to the threshold voltage of the P-channel transistor 322-appears at the node N320. Consequently, the gate voltage of the discharge transistor 321 exceeds the threshold voltage of the discharge transistor 321, so that the discharge transistor 321 is brought into conduction. As a result, the electric charges stored in the node N301 is sufficiently discharged. The N-channel transistor 302n of the inverter I302 is brought into a non-conducting state, thus bringing the P-channel transistor 302p into conduction.

At time T04, as a result of the charge capacitor 302c being recharged by way of the P-channel transistor 302p of the inverter I302, the potential of the node N302 substantially equals the line potential. As a result, the node N303 is brought to the ground potential, and the /POR signal is reset to a reset level, i.e., the line potential. Finally, at time T05, the line potential reaches a value of 5V.

In FIG. 6, provided that a voltage drop caused by the resistive element 111r is taken as a, the final potential of the node N110 assumes a value of 5V-α. Further, provided that the threshold voltages of the N-channel transistors 121n, 122n, and 123n are each equal to Vth, the final potential of the node N120 assumes a value of 5V-3Vth.

Figure 7:
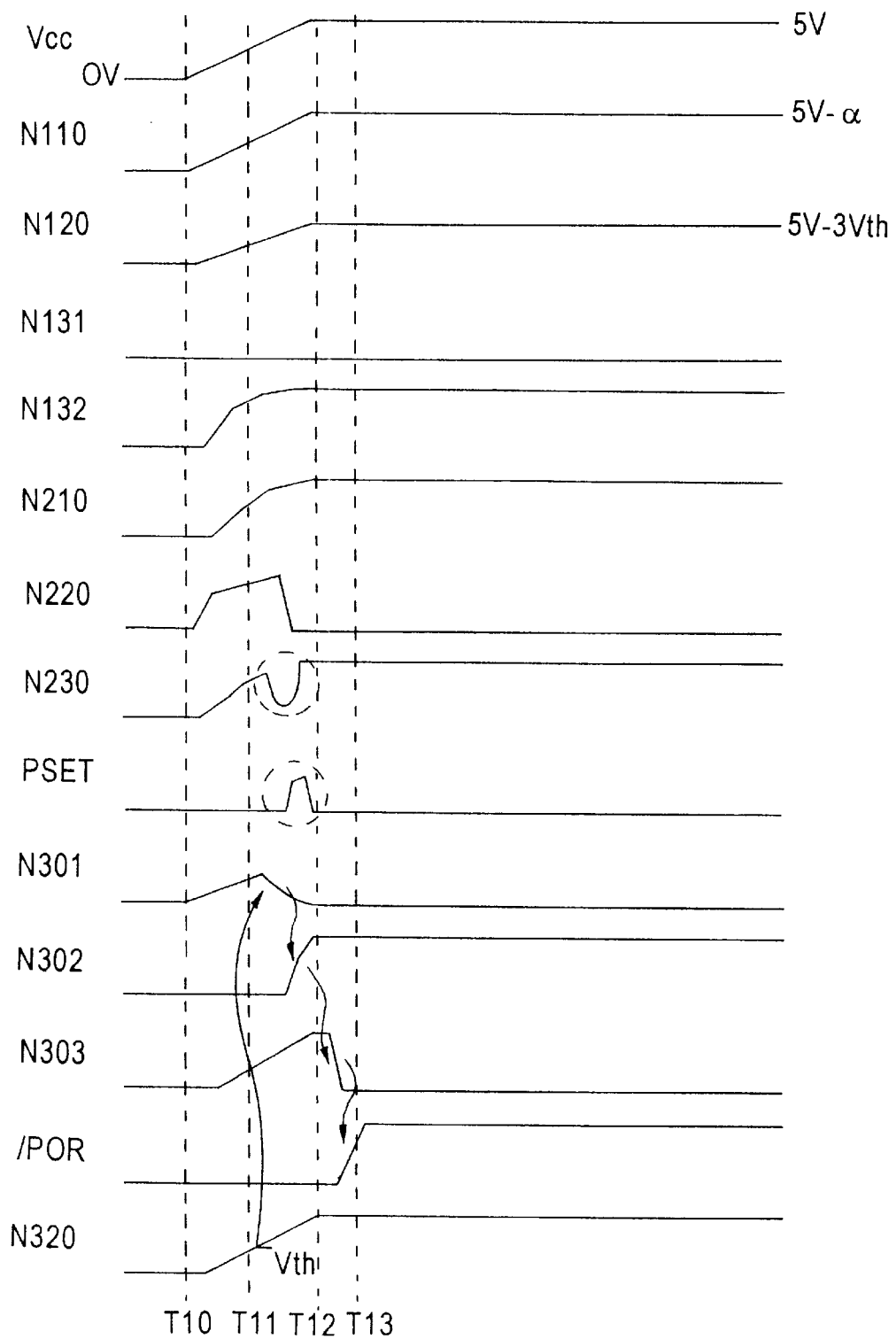
FIG. 7 is a timing chart showing an operation in a case of a rapid rise of line potential in the /POR circuit shown in FIG. 2.

FIG. 7 shows variations in the potentials of the individual nodes of the /POR circuit in a case where there is a rapid rise in the potential of a power supply voltage such that the voltage takes about 50 µs to rise from the ground potential (0V) to the line potential (5V) at power-on.

When the potential of the power supply starts to rise at time T10, the line potential sensing capacitor 301c of the /POR signal waveform generation circuit 300 shown in FIG. 5 monitors a rise in the line potential, and the potential of the node N301 rises. By means of a rise in the potential of the node N301, in combination with the capacitor 302c provided between the node N302 and the ground potential, the output node N302 of the inverter I302 is maintained at the ground potential. Further, by means of the input node N303 of the inverter I303 being maintained at the ground potential, in combination with the capacitor 303c connected between the node N303 and the power supply node Vcc, the node N303 substantially follows a rise in the potential of the power supply. Subsequently, the /POR signal is brought to a set level, i.e., the ground potential in the embodiment 1, and the node N320 rises so as to follow while lagging behind a rise in the power potential.

At time T11, the potential of the node N320 of the discharge circuit 320—which rises while lagging behind a rise in the potential of the power supply—exceeds the threshold voltage of the discharge transistor 321. As a result, the discharge transistor 321 is brought into conduction, and the electric charges stored in the node N301 by way of the transistor 321 is discharged.

At time T12, the potential of the node N301 is brought to the ground potential. In response to this, the potential of the node N302, the potential of the node N301, and the /POR signal change, in this order.

At time T13, in response to the variation in the potential of the node N301 that has been brought to the ground potential at time T12, the nodes change in order. As a result, the potential of the node N304, i.e., the /POR signal, is finally brought to the reset level, i.e., the line potential in the embodiment 1.

During the period from time T10 to time T13, a rise in the potential of the power supply is primarily determined by the transmission speed of a signal which is affected by the sizes of the individual inverters I301 to I305 and the size of the capacitors 301c to 304c. The speed of a rise in the potential of the power supply is designed beforehand through simulation so as to have a value of about 50 $\mu$s. In this case, compared with a case where there is a gentle rise in the potential of the power supply, the potential of the power supply rises in a considerably short period of time. Therefore, even if the pulse signal PSET is not produced, the power-on reset circuit operates normally, and the /POR signal assumes a desired waveform. Further, as shown in FIG. 7, even when the N-channel transistor 331 and the P-channel transistor 332 of the setting circuit 330 are brought into conduction by means of the pulse signal PSET which is output from the pulse signal generation circuit 200 as a result of receipt of the comparison result from the line potential detection circuit 100, the transistors 331 and 332 are in conduction during the period from time T10 to time T12. Accordingly, the transistors 331 and 332 merely determine the potential of the nodes N304 and N303, so that the power-on reset circuit operates normally.

As mentioned above, in the /POR circuit according to the embodiment 1, even if the line potential sensing capacitor 301c fails to sufficiently fulfill its performance when there is a gentle rise in the potential of the power supply at power-on, the line potential detection circuit 100 detects the potential of the power supply by means of the first and second monitor voltages. Further, by means of the pulse signal PSET corresponding to the result of such detection, there is output a /POR signal having a waveform maintained at a reset level sufficient for reliably resetting internal circuits at power-on, i.e., a ground potential.

Embodiment 2

Figure 8:
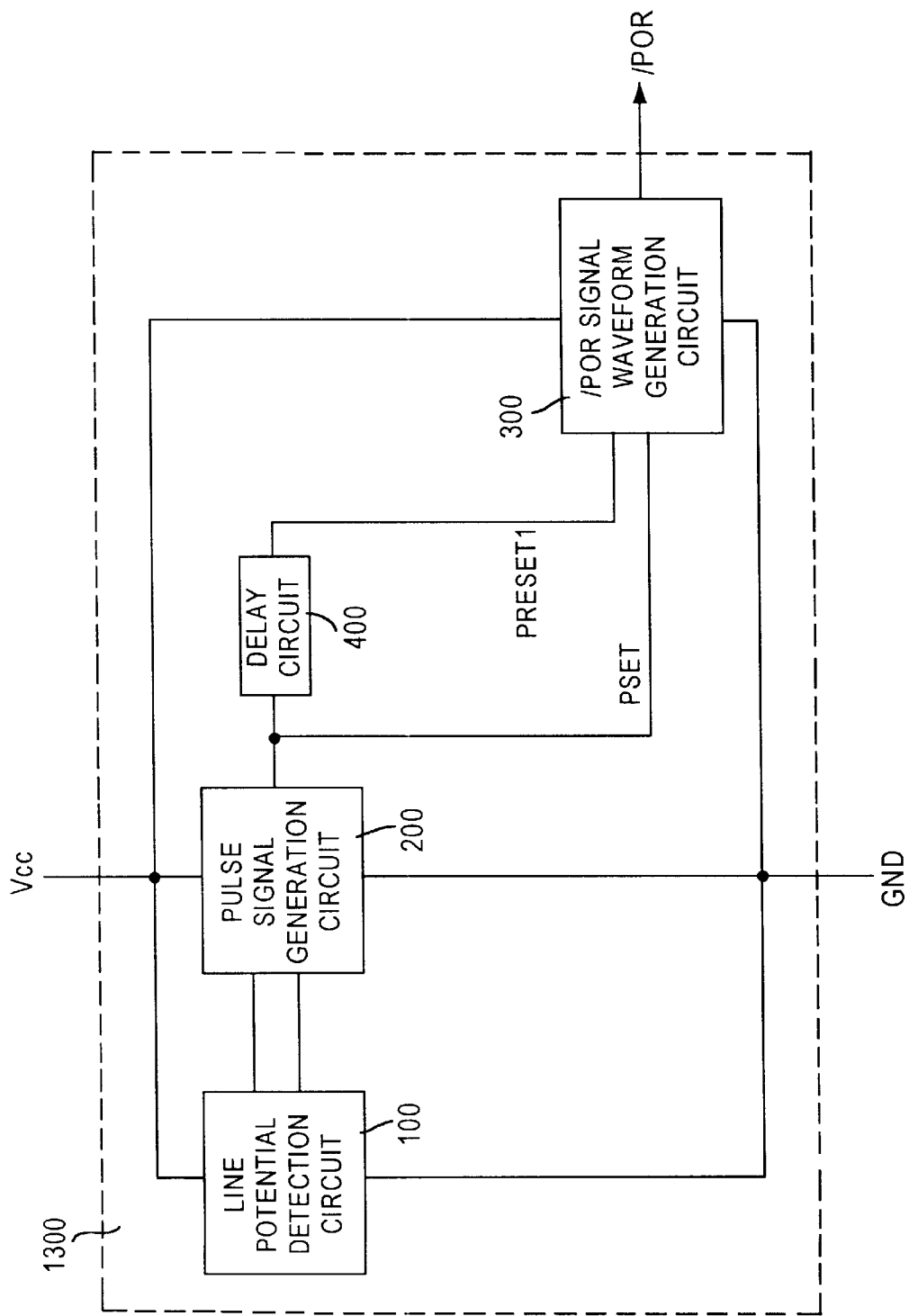
FIG. 8 is a block diagram showing a configuration of a /POR circuit according to embodiment 2 of the present invention.

FIG. 8 is a block diagram showing the configuration of a /POR circuit according to embodiment 2 of the present invention. A /POR circuit 1300 comprises a line potential detection circuit 100 for detecting a rise in the potential of the power supply; a pulse signal generation circuit 200 which produces a pulse signal upon receipt of a detection result output from the line potential detection circuit 100; a delay circuit 400 which outputs the pulse signal received from the pulse signal generation circuit 200 after having delayed the pulse signal for a predetermined period of time; and a /POR signal waveform generation circuit 300 which without fail brings the /POR signal to a set level by means of the pulse signal PSET output from the pulse signal generation circuit 200 and which without fail brings the /POR signal to a reset level in response to a signal output from the delay circuit 400. The /POR circuit 1300 according to the embodiment 2 differs from the /POR circuit 1300 according to the embodiment 1 in that the delay circuit 400 is added, and in the configuration of the /POR signal waveform generation circuit 300. The following explanation describes these points of difference.

Figure 9:
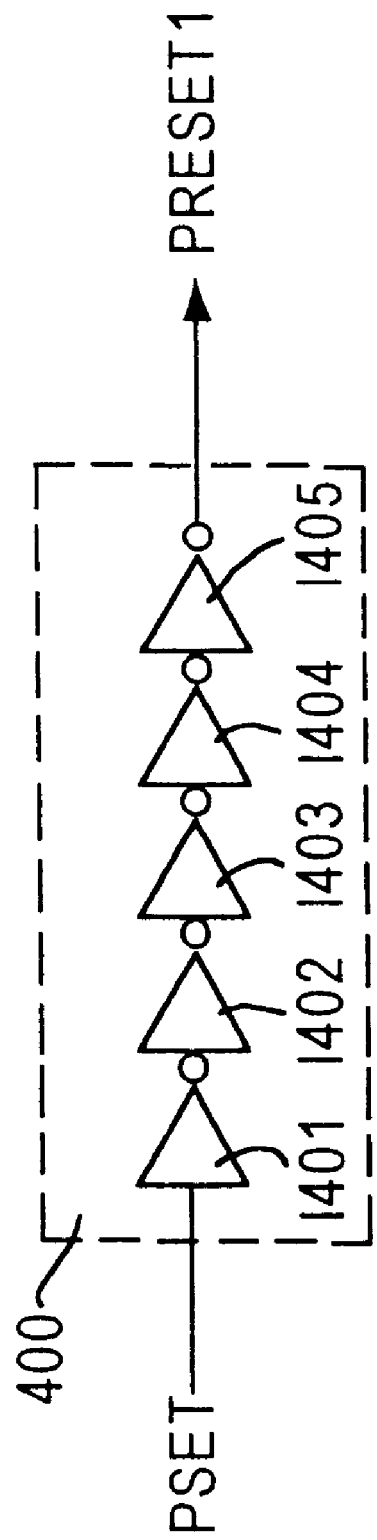
FIG. 9 is a circuit diagram showing a configuration of a delay circuit shown in FIG. 8.

FIG. 9 is a circuit diagram showing a specific example of the delay circuit 400 shown in FIG. 8. The delay circuit 400 receives the first pulse signal PSET which is output from the pulse signal generation circuit 200 and comprises inverters I401, I402, I403, I404, and I405 connected in series. The inverter I405 provided at the last stage outputs a second pulse signal PRESET1 for the purpose of resetting the /POR signal without fail.

Figure 10:
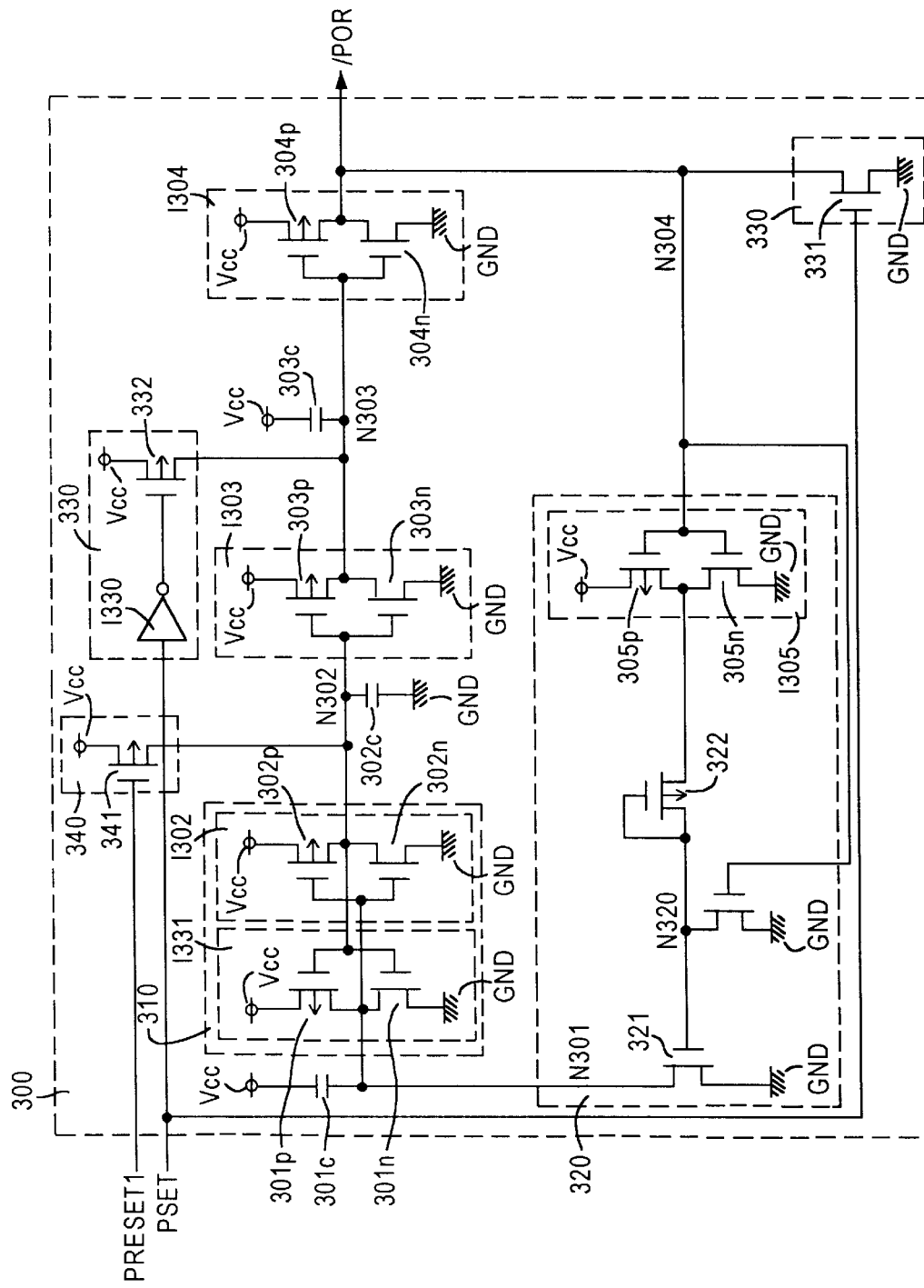
FIG. 10 is a circuit diagram showing a configuration of a /POR signal waveform generation circuit in the /POR circuit shown in FIG. 8.

FIG. 10 is a circuit diagram showing a specific example of the /POR signal waveform generation circuit 300 shown in FIG. 8. The /POR signal waveform generation circuit shown in FIG. 10 corresponds to the /POR signal waveform generation circuit shown in FIG. 5 to which a reset circuit 340 is newly added in order to bring the /POR signal to an activation potential without fail in response to the pulse signal PRESET1 which is output from the delay circuit 400. The reset circuit 340 comprises a P-channel transistor 341 which is connected between the power supply node Vcc and the node N302 and which receives at its gate the pulse signal PRESET1 from the delay circuit 400.

Figure 11:
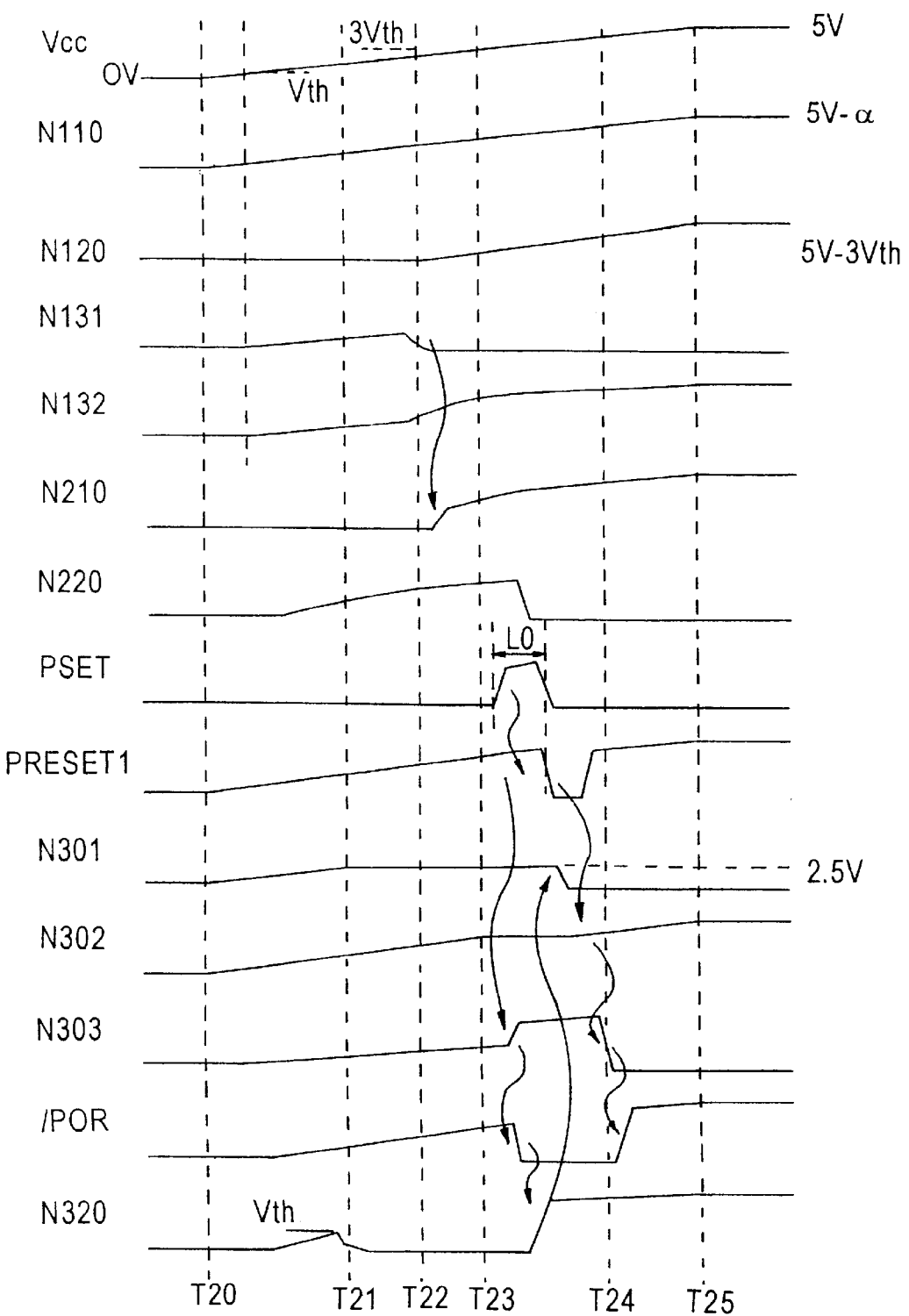
FIG. 11 is a timing chart showing an operation in a case of a rapid rise of line potential in the /POR circuit shown in FIG. 8.

The operation of the power-on reset circuit according to the embodiment 2 will now be described. FIG. 11 shows a timing chart showing the operation of the power-on reset circuit according to embodiment 2. More specifically, the timing chart shows variations in the potentials of individual nodes of the /POR circuit when the potential of the power supply rises from the ground potential (0V) to the line potential (5V) over a period of about 5 ms.

During the period from time T20 to time T23, the power-on reset circuit operates in the same manner as does that according to the embodiment 1. Subsequently, the second pulse signal PRESET1 is produced at time T23 by means of the delay circuit 400 delaying the first pulse signal PSET output from the pulse signal generation circuit 200 by a predetermined period of time (the duration denoted by L0 in FIG. 11). As a result, the P-channel transistor 341 included in the setting circuit 340 of the /POR signal waveform generation circuit 300 is brought into conduction.

At time T24, the node N302 and the capacitor 302c are recharged by way of the P-channel transistor 341, which has been brought into conduction by means of the reset signal PRESET1. As a result, the potential of the node N302 becomes substantially equal to the line potential. Then, the node N303 is brought to the ground potential, and the /POR signal is reset to a reset level, i.e., the line potential. Finally, at time T25, the line potential reaches a value of 5V.

With such a configuration, in a case where the potential of the power supply rises gently and where discharging the electric charge stored in the node N301 and raising the potential of the node N302 take an extremely long time, or where a balance in potential rise among the individual nodes is lost due to deficiencies in manufacturing processes, the /POR signal can be reset without fail. In a case where the electric charge is quickly discharged from the node N301, the potential of the node N302 rises as a result of charging of the P-channel transistor included 302p in the inverter I302. Therefore, if the reset transistor 341 is brought into conduction later, only the charging capacity of the power-on reset circuit is strengthened.

As mentioned above, in the /POR circuit according to the embodiment 2, in a case where the potential of the power supply rises gently at power-on, if the line potential sensing capacitor 301c fails to fulfill its function, the line potential detection circuit 100 detects the potential of the power supply through use of the first and second monitor voltages. Further, the pulse signal is maintained at the ground potential, i.e., an activation potential sufficient for resetting internal circuits without fail when the power supply voltage is supplied, by means of the pulse signal PSET responding to the result of such detection. After elapse of a predetermined period of time, a /POR signal having a waveform which is brought to a non-activation potential is output by means of the delayed signal PRESET1 of the pulse signal.

Embodiment 3

Figure 12:
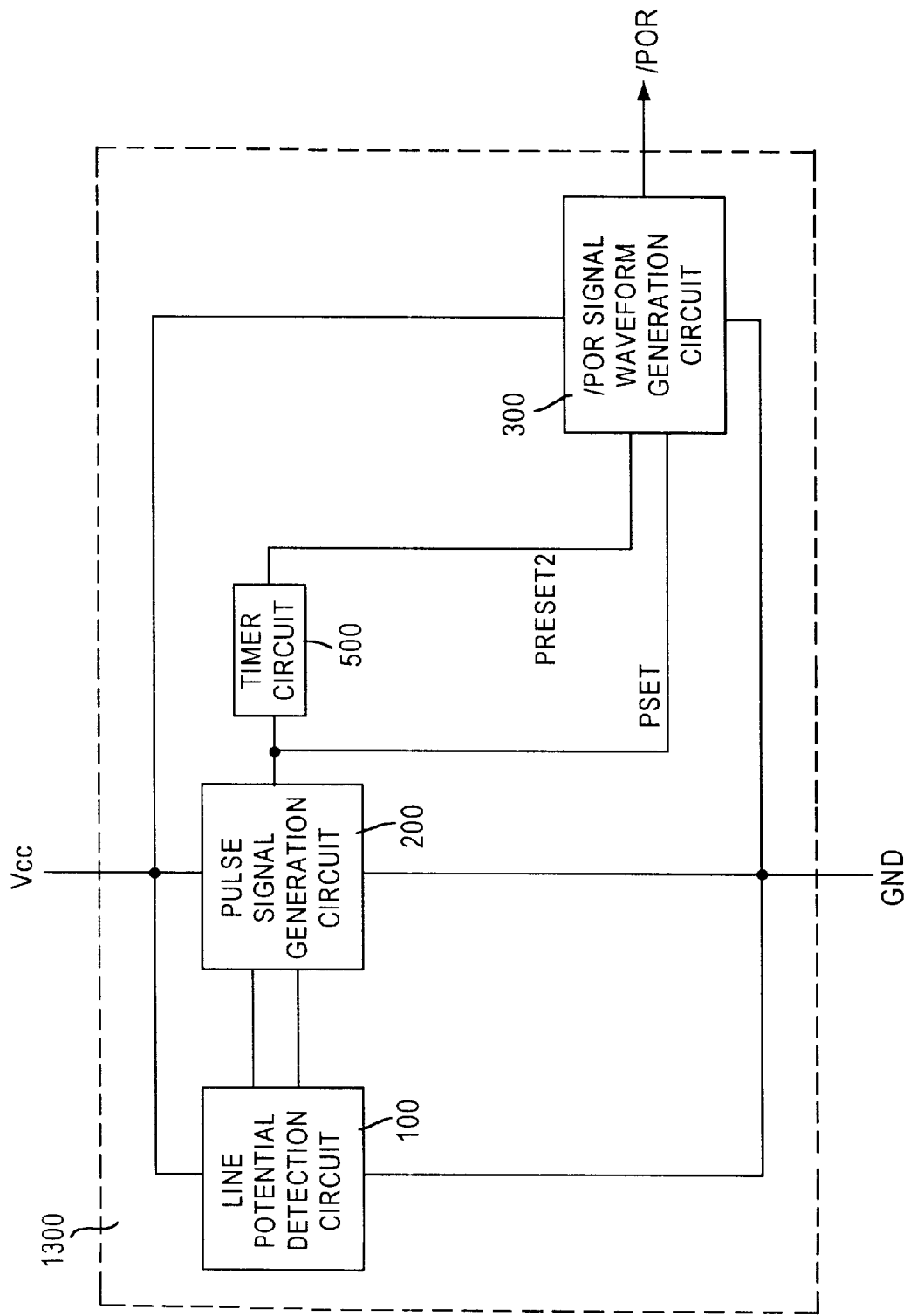
FIG. 12 is a block diagram showing configuration of a /POR circuit according to embodiment 3 of the present invention.

FIG. 12 is a block diagram showing the configuration of a /POR circuit according to a embodiment 3 of the present invention. A /POR circuit 1300 comprises a line potential detection circuit 100 for detecting a rise in the potential of the power supply; a pulse signal generation circuit 200 which produces a pulse signal upon receipt of a detection result output from the line potential detection circuit 100; a timer circuit 500 which receives the pulse signal PSET output from the pulse signal generation circuit 200 and outputs a signal PRESET2 after lapse of a given period of time; and a /POR signal waveform generation circuit 300 which brings the /POR signal to a set level without fail by means of the pulse signal PSET output from the pulse signal generation circuit 200 and which brings the /POR signal to a reset level without fail in response to the PRESET2 output from the timer circuit 500. The /POR circuit 1300 according to embodiment 3 differs from the /POR circuit 1300 according to embodiment 2 in that the /POR circuit according to embodiment 3 has the timer circuit 500 in place of the delay circuit 400. The following explanation describes this difference.

Figure 13:
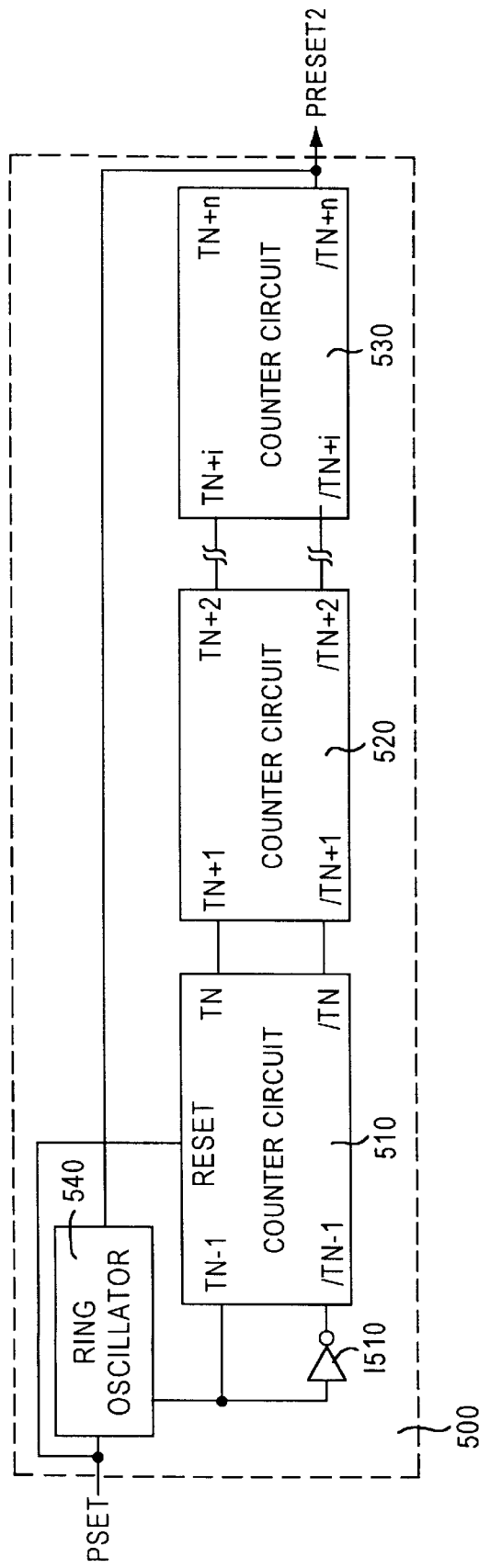
FIG. 13 is a block diagram showing a configuration of a timer circuit shown in FIG. 12.

FIG. 13 is a block diagram showing a specific example of the timer circuit 500 shown in FIG. 12. The timer circuit 500 comprises a ring oscillator 540 which starts oscillation in response to a pulse signal PSET output from the pulse signal generation circuit 200; counter circuits 510, 520, and 530 which perform count-up operations in response to a clock signal output from the ring oscillator; and an inverter I510.

As shown in FIG. 13, although "n" counter circuits are used in the example, the number of counter circuits is determined according to the time desired to be counted by the timer circuit.

Figure 14:
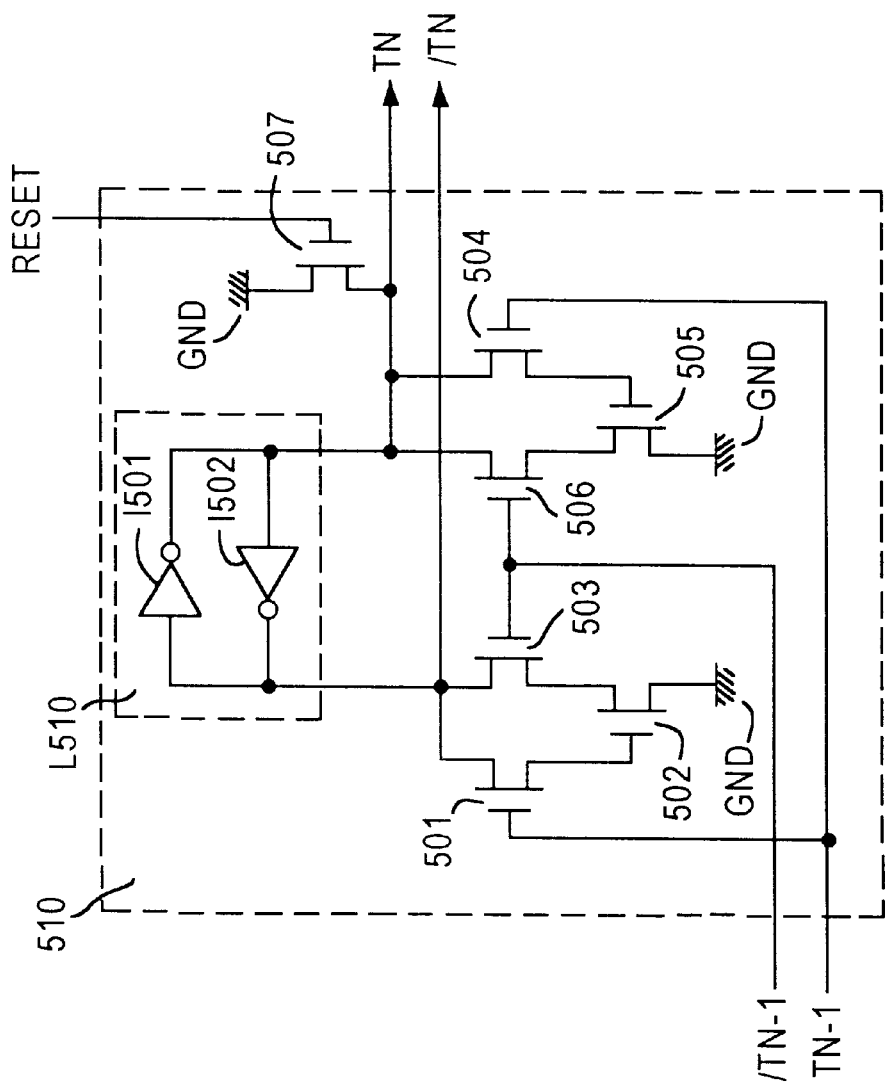
FIG. 14 is a circuit diagram showing a configuration of a counter circuit shown in FIG. 13.

FIG. 14 is a circuit diagram showing a specific example of a counter circuit 510 shown in FIG. 13. The counter circuit 510 comprises N-channel transistors 503 and 506 which receive at their gates an input signal /TN-1 produced by the clock signal from inversion of the ring oscillator 540 by the inverter I540; N-channel transistors 501 and 504 which receive at their gates an input signal TN-1, i.e., a clock signal output from the ring oscillator 540; an N-channel transistor 502 which is connected between the source of the N-channel transistor 503 and the ground node GND and whose gate is connected to the source of the N-channel transistor 501; an N-channel transistor 505 which is connected between the source of the N-channel transistor 506 and the ground node GND and whose gate is connected to the source of the N-channel transistor 504; and inverters I501 and I502 constituting a latch circuit L510 which latches data regarding output signals TN and /TN.

The counter circuit shown in FIG. 14 represents the lowest-level counter circuit among the timer circuits 500 shown in FIG. 13. Therefore, the counter circuit includes an N-channel transistor 507 for initial setting of the counter circuit which is connected between the ground node GND and the output node of the output signal TN and which receives at its gate the pulse signal PSET.

Figure 15:
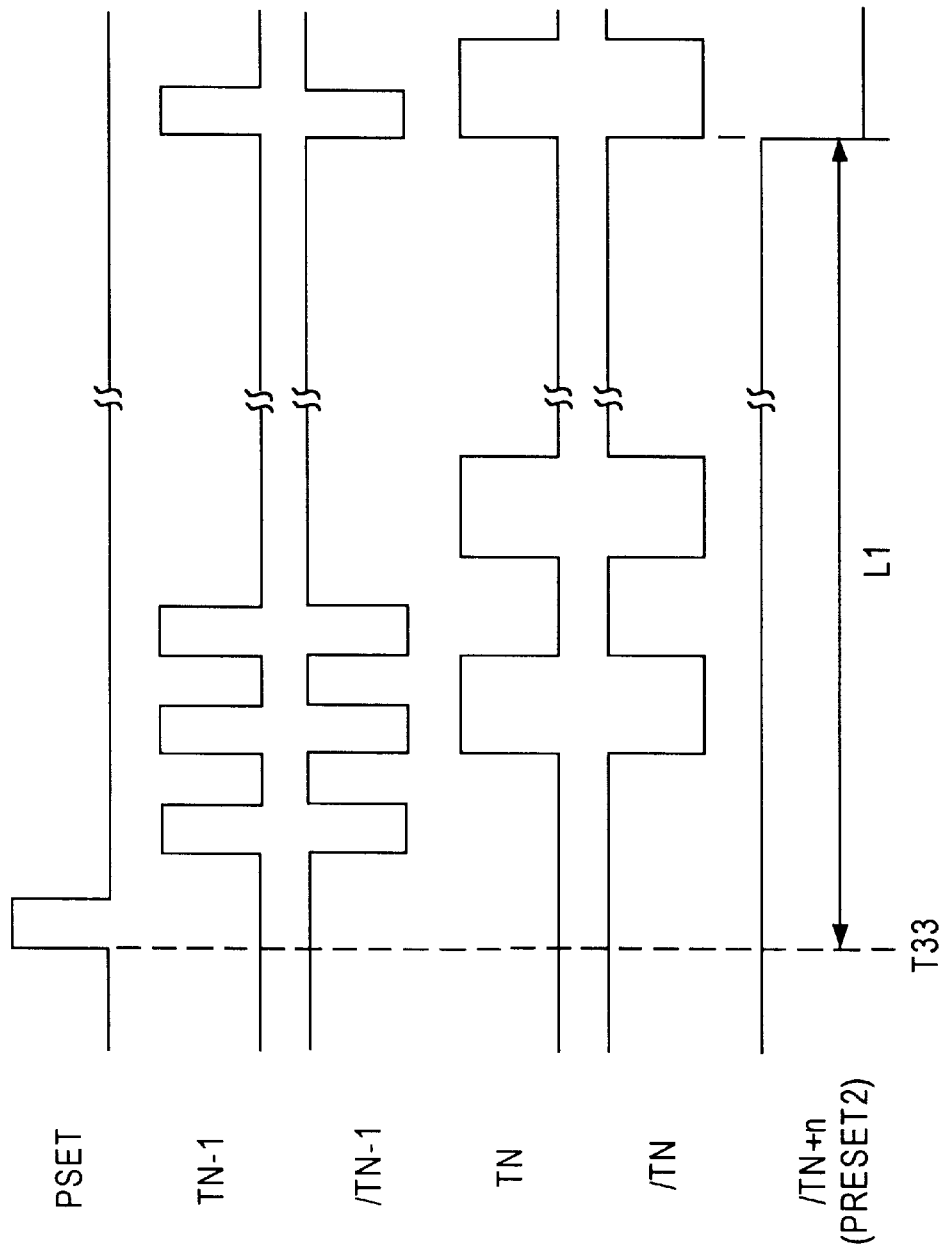
FIG. 15 is a timing chart representing operations of the timer circuit shown in FIG. 13.

FIG. 15 shows a timing chart representing operations of a timer circuit 500. As shown in FIG. 13, assuming that the timer circuit 500 is constituted of "n" counter circuits, the ring oscillator 540 starts oscillating upon receipt of the pulse signal PSET output from the pulse signal generation circuit 200. The thus-oscillated signal is input to the counter circuit, where counting operations are performed for a given period of time L1. The PRESET2 signal for resetting the /POR signal is output from the counter circuit 530 provided on the final stage.

In other respects, the /POR circuit 1300 shown in FIG. 12 is equal in configuration to that described in the embodiment 2, except for the timer circuit 500. Particularly, the /POR signal waveform generation circuit 300 is equal in configuration to that shown in FIG. 8, and the PRESET1 signal input to the reset circuit 340 is output as the PRESET2 signal from the timer circuit 500.

Figure 16:
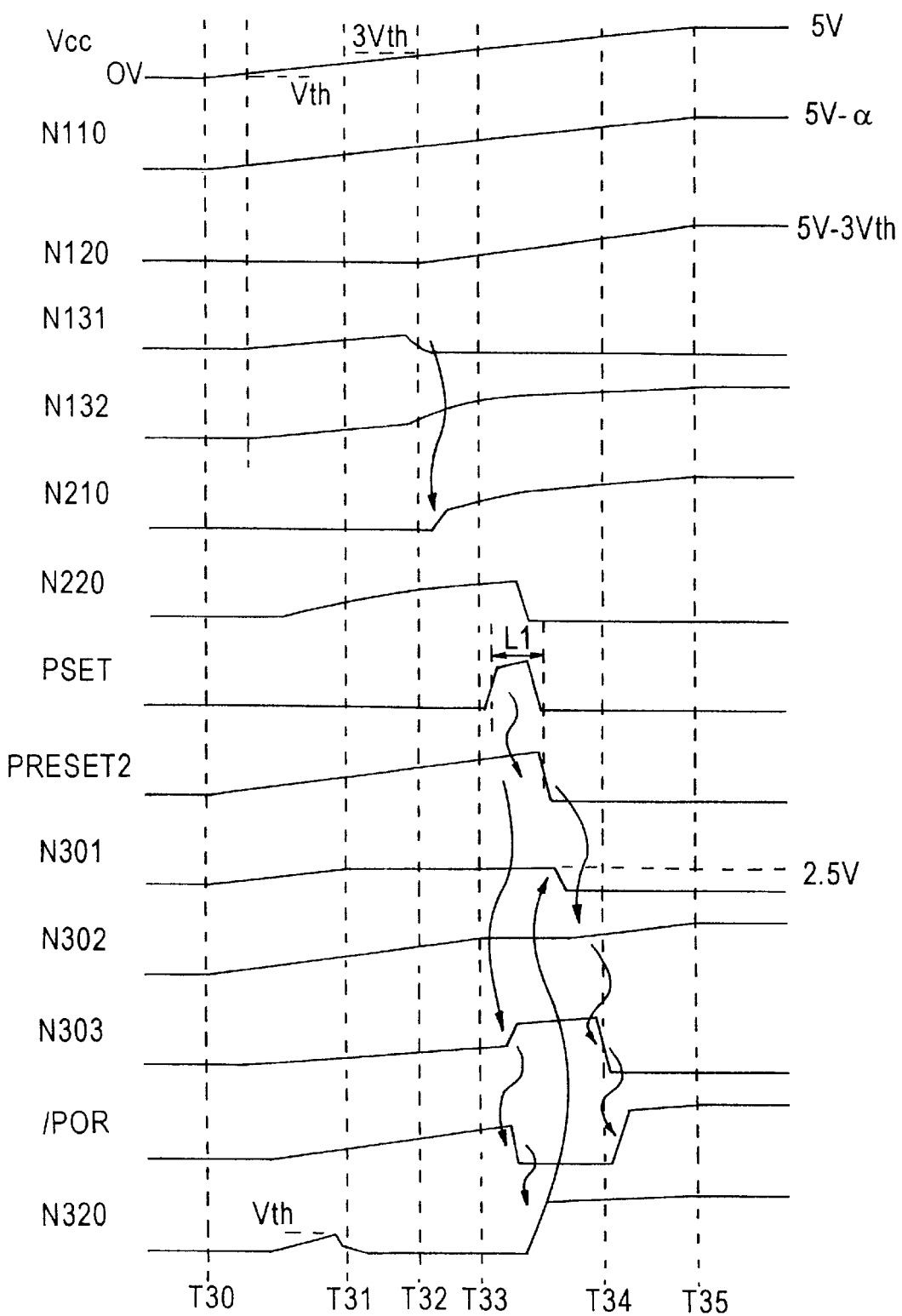
FIG. 16 is a timing chart showing operations in a case of a gentle rise of line potential in the /POR circuit shown in FIG. 12.

The operation of the power-on reset circuit will now be described. FIG. 16 is a timing chart showing the operations of the power-on reset circuit according to embodiment 3. The drawing shows variations in the potentials of individual nodes of the /POR circuit in a case where the potential of the power supply takes about 5 ms to rise from the ground potential (0V) to the line potential (5V).

During the period from time T30 to time T33, the power-on reset circuit operates in the same manner as do the power-on reset circuits according to embodiments 1 and 2. Subsequently, on the basis of the pulse signal PSET output from the pulse signal generation circuit 200, the signal PRESET2 is produced after a predetermined period of time (the duration denoted by L1 in FIG. 16) has lapsed, as determined by the timer circuit 500. As a result, the P-channel transistor 341 included in the setting circuit 340 of the /POR signal waveform generation circuit 300 is brought into conduction.

The operation of the timer circuit 500 during the foregoing period will now be described by reference to FIG. 15. At time T33, the timer circuit 500 receives the pulse signal PSET output from the pulse signal generation circuit 200. In response to the thus-received pulse signal PSET, the ring oscillator 540 starts oscillating. Simultaneously, the N-channel transistor 507 of the counter circuit 510 is brought into conduction, thereby performing the initial setting of the counter. In response to the oscillated signal output from the ring oscillator 540, the counter circuits count up in sequence. Finally, the highest-level counter circuit 530 performs a count-up operation after elapse of period L1 from time T3, so that the output signal PRESET2 is brought to the ground potential.

The timer circuit 500 performs a counting operation during the course of a rise in the potential of the power supply. Therefore, sufficient consideration must be given to that point in constructing the timer circuit.

At time T34, the node N302 and the capacitor 302c are recharged by way of the P-channel transistor 341, which is in conduction therewith by means of the reset signal PRESET2, thereby rendering the potential of the node N302 substantially equal to the line potential. As a result, the node N303 is brought to the ground potential, and the /POR signal is reset to the reset level, i.e., the line potential. Finally, at time T35, the line potential reaches a value of 5V.

As mentioned above, the /POR circuit according to the embodiment 3 can output the /POR signal which is maintained for a given period of time at the ground level, i.e., a set level sufficient for resetting the internal circuits without fail at power-on even in a case where the potential of the power supply voltage rises gently, and which is reset to a reset level without fail after lapse of the given period of time.

Embodiment 4

Figure 17:
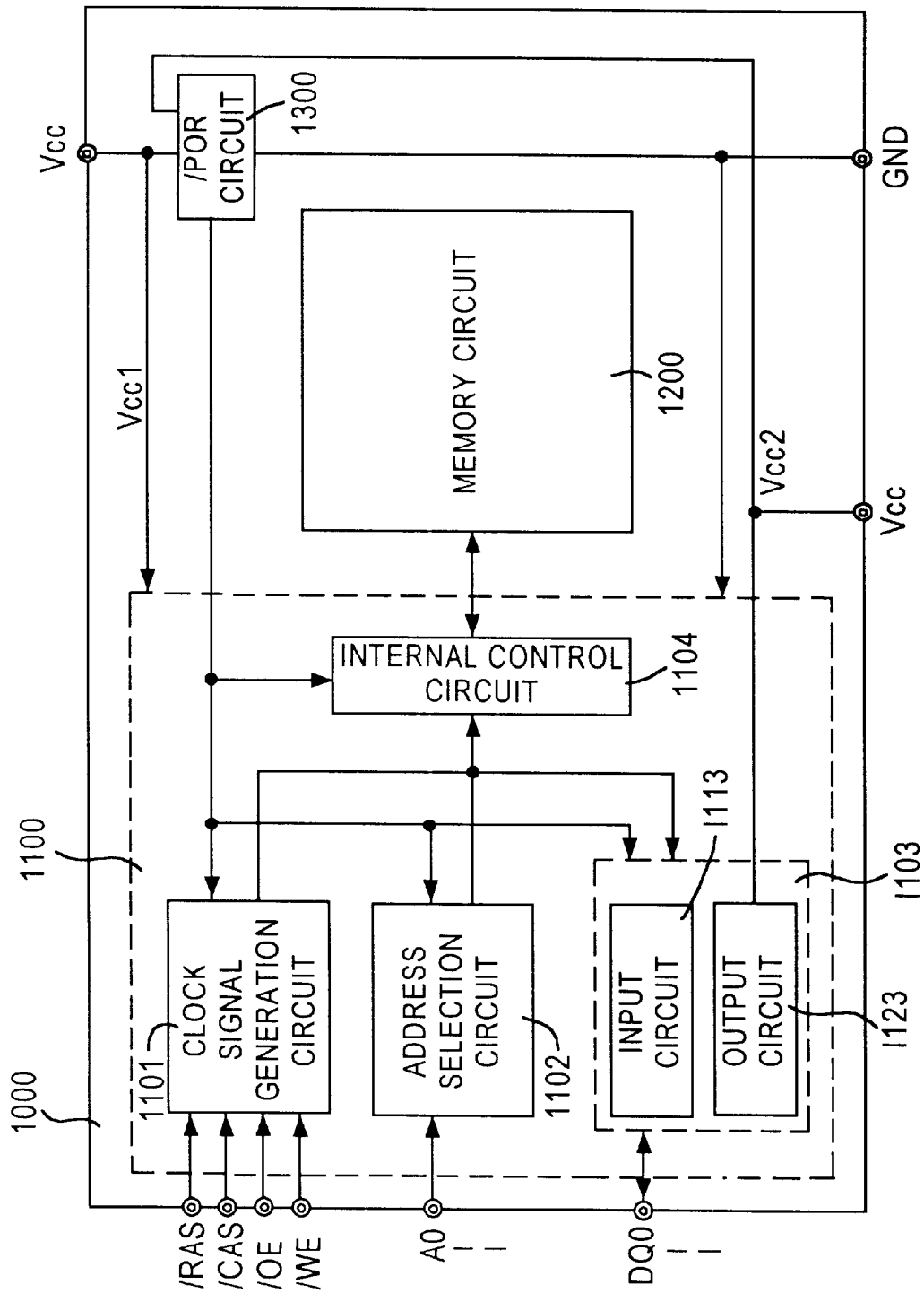
FIG. 17 is a block diagram showing a configuration of a DRAM according to embodiment 4 of the present invention.

FIG. 17 is a block diagram showing a DRAM using a power-on reset circuit according to a embodiment 4 of the present invention. The DRAM differs from that shown in FIG. 1 in the following points; namely, the input/output circuit 1103 comprises an input circuit 1113 which acquires data input by way of a data input/output terminal during data-write operations, and an output circuit 1123 which outputs the data read from the memory circuit 1200 by way of the input/output terminal during data-read operations. Further, the DRAM has two power supply terminals; namely, a power supply line Vcc2 specifically-designed for use with an output circuit and power supply line Vcc1. The line potential detection circuit of the /POR circuit detects variations in the potentials of the power supply lines Vcc1 and Vcc2. The /POR circuit 1300 according to the embodiment 4 differs from those according to embodiments 1, 2 and 3 in terms of configuration of the line potential detection circuit 100. The following explanation describes this difference.

Figure 18:
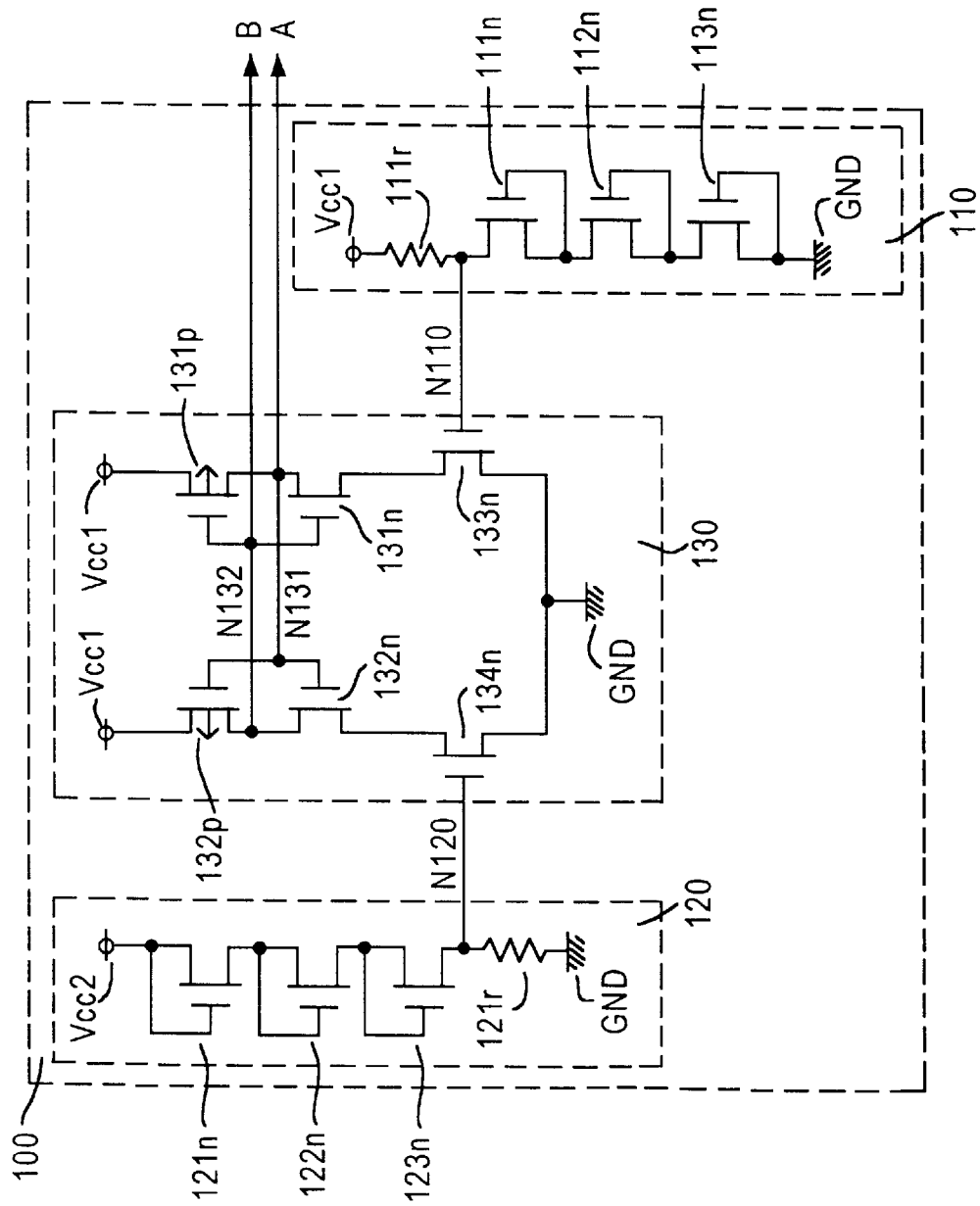
FIG. 18 is a circuit diagram showing a configuration of a line potential detection circuit of the /POR circuit shown in FIG. 17.
Figure 19:
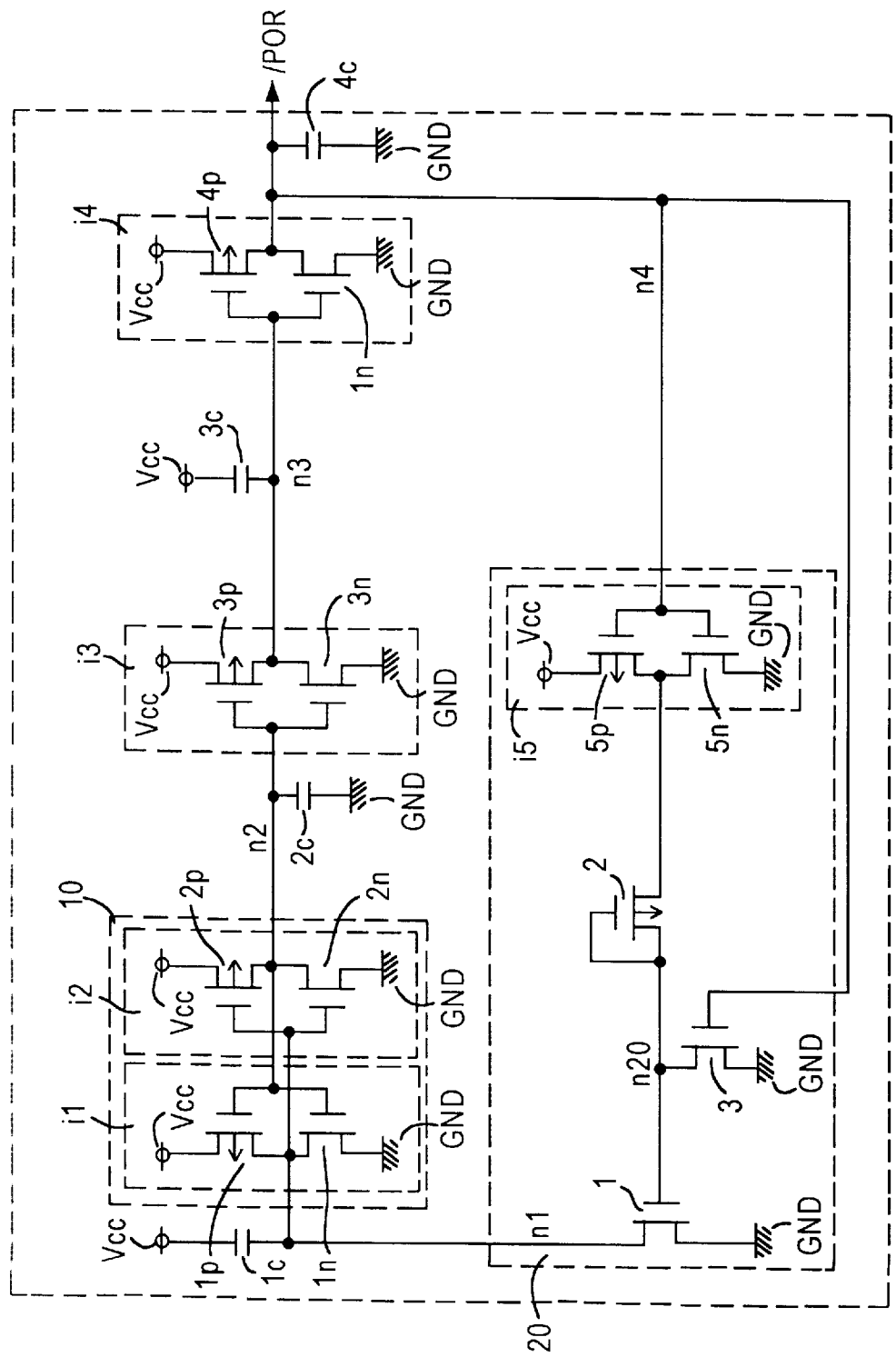
FIG. 19 is a circuit diagram showing a configuration of a conventional /POR circuit.
Figure 20:
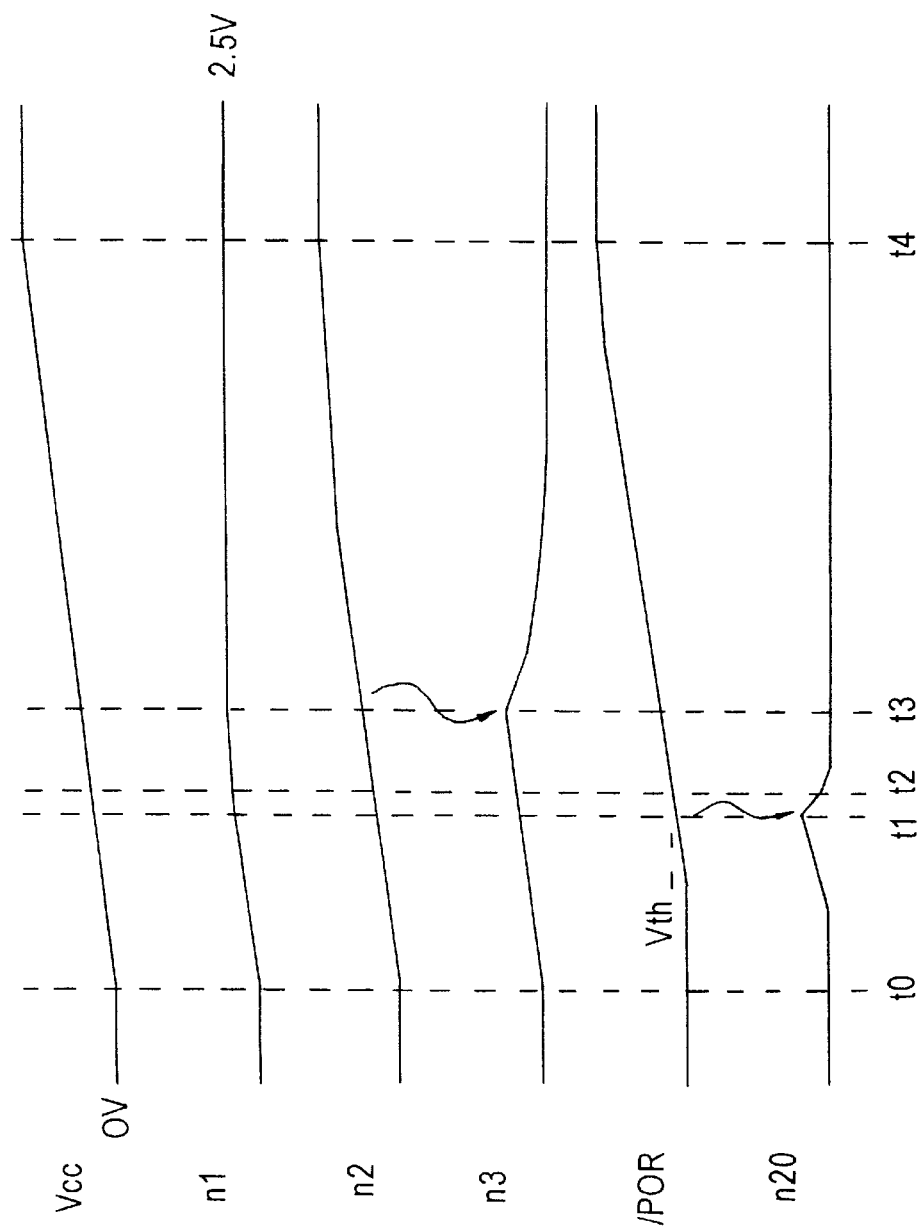
FIG. 20 is a timing chart showing operations in a case of a gentle rise of line potential in a conventional /POR circuit.

FIG. 18 is a circuit diagram showing the configuration of the line potential detection circuit 100 of the /POR circuit shown in FIG. 17. The line potential detection circuit 100 comprises a first line potential monitoring circuit 110; a second line potential monitoring circuit 120; and a comparison circuit 130 which compares a first monitor voltage output from the first line potential monitoring circuit 110 with a second monitor voltage output from the second line potential monitoring circuit 120 and outputs the result of such comparison. Particularly, the line potential detection circuits according to embodiment 4 differ from those shown in FIG. 3 in that the power supply node of the second line potential monitoring circuit 120 is connected not to the power supply node Vcc1 of the first line potential monitoring circuit 110 but to the output-only power supply line Vcc2 shown in FIG. 17.

As mentioned above, the /POR circuit according to embodiment 4 is arranged so as to detect variations in a rise in the potentials of the power supply line nodes having different time constants. Accordingly, there can be output a /POR signal having a waveform maintained at the ground level, i.e., a set level sufficient for resetting internal circuits in consideration of a variation in the rise of potential in power supply nodes stemming from a wiring relationship between power supply terminals and circuits.

In the present invention, the line potential is described as having a value of 5V. In a device which operates at a low line voltage such as a 3V or 2.8V, the accuracy of detection of a supply voltage must be increased by the amount corresponding to a reduction in the difference between the ground potential and the line potential. Accordingly, the present invention yields a particularly remarkable effect.

Further, the power-on reset circuit according to the present embodiment produces a /POR signal. The period during which the /POR signal is at the ground potential corresponds to an activation period during which internal circuits are subjected to initial setting. When the /POR signal is brought to the line potential, the initial setting operations are completed, thereby resulting in the period during which the /POR signal becomes inactive. It goes without saying that the present invention can be applied to even a power-on reset circuit in which initial setting of internal circuits is performed through use of a signal which is at the ground potential during an inactive period and is reverse phase with the /POR signal, i.e., a signal whose set level is at the line potential and whose reset level is at the ground potential.

As mentioned previously, in the power-on reset circuit according to the present invention, a pulse signal generation circuit outputs a first pulse signal in response to a detection result output from a line potential detection circuit. The line potential detection circuit comprises a first line potential monitoring circuit which includes a first voltage dividing circuit connected between the power supply node and the ground node and which outputs a first monitor voltage; a second line potential monitoring circuit which includes a second voltage dividing circuit connected between the power supply node and the ground node and which outputs a second monitor voltage; and a comparison circuit which compares the first monitor voltage with the second monitor voltage. A power-on reset signal waveform generation circuit-which produces a power-on reset signal upon sensing a rise in the line potential-is provided with a setting circuit which brings the power-on reset signal to the activation potential in response to the first pulse signal. The supply of a power supply voltage can be detected even by means of the line potential detection circuit without dependence on solely the power-on reset signal waveform generation circuit. Accordingly, the power-on reset circuit can output a power-on reset signal having a waveform maintained at an activation potential, i.e., the ground potential sufficient for initializing internal circuits without fail even in a case where the potential of the power supply rises gently at power-on.

Further, the power-on reset circuit is arranged in such a way that the first monitor voltage rises faster than the second monitor voltage when there is a rise in the potential of the powers supply. Accordingly, the accuracy of detection of a power supply by means of the. line potential detection circuit can be improved.

The power-on reset circuit is further provided with a delay circuit which receives the first pulse signal from the pulse signal generation circuit and outputs a second pulse signal by delaying the first pulse signal for a predetermined period of time. Furthermore, the power-on reset signal waveform generation circuit is provided with a reset circuit which brings the power-on reset signal to a deactivation potential in response to the second pulse signal. Therefore, the power-on reset circuit can output a power-on reset signal having a waveform which is maintained at the ground potential, i.e., an activation potential sufficient for initializing internal circuits without fail even in a case where the potential of the power supply rises gently at power-on, and which is brought to a deactivation potential without fail after elapse of the predetermined period of time.

The power-on reset circuit is further provided with a timer circuit which receives the first pulse signal from the pulse signal generation circuit and which measures the predetermined period of time in response to the first pulse signal. The power-on reset signal waveform generation circuit is further provided with a reset circuit which brings the power-on reset signal to the deactivation potential in response to the signal output from the timer circuit. Therefore, the power-on reset circuit can output a power-on reset signal having a waveform which is maintained at the ground potential, i.e., an activation potential sufficient to initialize internal circuits without fail even in a case where the potential of the power supply gently rises at power-on, and which is brought to a deactivation potential without fail after elapse of the predetermined period of time.

The setting circuit is connected between the output node of the power-on reset signal output node and a predetermined node corresponding to the activation potential of the power-on reset signal. The setting circuit is arranged so as to be brought into conduction in response to the first pulse signal. As a result, the power-on reset signal can be effectively brought to the power-on reset signal without fail.

The power-on reset circuit according to the present invention comprises a line potential detection circuit which detects a rise in the potential of the power supply in response to the first and second monitor voltages, each of which is output in response to the rise in the potential of the power supply; a pulse signal generation circuit which produces a pulse signal in response to the first and second detection results output from the line-potential detection circuit; a setting circuit which brings the power-on reset signal to the activation potential in response to the pulse signal; and a power-on reset signal waveform generation circuit which produces the power-on reset signal upon sensing a rise in the potential of the power supply. Accordingly, the line potential detection circuit can detect the supply of a power supply voltage without fail even in a case where the potential of the power supply rises gently at power-on. Further, even under unstable conditions in which the potential of the power supply is rising, a pulse signal can be reliably produced. Accordingly, the power-on reset circuit can output a power-on reset signal having a waveform maintained at. the activation potential sufficient for initializing internal circuits, i.e., the ground potential.

Further, the first and second monitor voltages are arranged so as to be output in response to a rise in the potentials of power supply lines having different time constants. Therefore, particularly in a case where DRAM comprises a plurality of power supply lines, a rise in the potential of the power supply can be finally detected from rises in the potentials of the power supply lines.

In a semiconductor device according to the present invention, a power-on reset circuit comprises a line potential detection circuit which detects a rise in the potential of the power supply according to the first and second monitor voltages, each being output in response to a rise in the potential of the power supply; a pulse signal generation circuit which produces a pulse signal in response to a first detection result and a second detection result output from the line potential detection circuit; a setting circuit which brings the power-on reset signal to the activation potential in response to the pulse signals; and a power-on reset signal waveform generation circuit which produces the power-on reset signal upon sensing a rise in the potential of the power supply. The power-on reset circuit and internal circuits initialized in response to the power-on reset signal are integrated into a single chip. As a result, even in a case where the potential of the power supply rises gently at power-on, the power-on reset signal is maintained at the activation potential, i.e., the ground potential. The internal circuits can be initialized without fail when the potentials of the internal circuits provided on the single chip of the semiconductor device attain a certain degree of stability.

Further, the first and second monitor voltages are output in response to a rise in the potentials of the power supply lines having different time constants. Even in a case where a plurality of power supply lines having different time constants are present in a single chip, a rise in the potential of the power supply can be reliably detected.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-202624 filed on Jul. 17, 1998 including specification, claims, drawings and summary are incorporated herein by reference in its entirety.

What is claimed is:

1. A power-on reset circuit comprising:
 a line potential detection circuit having
  a first line potential monitoring circuit which includes a first voltage dividing circuit connected between a power supply node and a ground node and which outputs a first monitor voltage,
  a second line potential monitoring circuit which includes a second voltage dividing circuit connected between a power supply node and a ground node and which outputs a second monitor voltage, and
  a comparison circuit which compares the first monitor voltage with the second monitor voltage;
 a pulse signal generation circuit which outputs a first pulse signal in response to the detection results output from said line potential detection circuit;
 a power-on reset circuit which has a setting circuit which brings a power-on reset signal to a set level in response to the first pulse signal and which produces the power-on reset signal upon sensing a rise in the potential of the power supply; and
 a delay circuit which receives the first pulse signal output from the pulse signal generation circuit and which outputs a second pulse signal by delaying the first pulse signal by a predetermined period of time; and wherein
 said power-on reset signal waveform generation circuit further includes a reset circuit which brings the power-on reset signal to a deactivation potential in response to the second pulse signal.

2. A power-on reset circuit comprising:
 a line potential detection circuit having
  a first line potential monitoring circuit which includes a first voltage dividing circuit connected between a power supply node and a ground node and which outputs a first monitor voltage,
  a second line potential monitoring circuit which includes a second voltage dividing circuit connected between a power supply node and a ground node and which outputs a second monitor voltage, and
  a comparison circuit which compares the first monitor voltage with the second, monitor voltage;
 a pulse signal generation circuit which outputs a first pulse signal in response to the detection results output from said line potential detection circuit;
 a power-on reset circuit which has a setting circuit which brings a power-on reset signal to a set level in response to the first pulse signal and which produces the power-on reset signal upon sensing a rise in the potential of the power supply; and a timer circuit which receives the first pulse signal from said pulse signal generation circuit and measures a predetermined period of time in response to the first pulse signal; and wherein said power-on reset signal waveform generation circuit further includes a reset circuit which brings the power-on reset signal to the deactivation potential in response to a signal output from said timer circuit.

3. The power-on reset circuit according to claim 2, wherein said timer circuit comprises an oscillation circuit which starts oscillation in response to the first pulse signal and a counter circuit which performs a count-up operation in response to an oscillating signal from said oscillation circuit.

4. A power-on reset circuit comprising:

a line potential detection circuit having
- a first line potential monitoring circuit which includes a first voltage dividing circuit connected between a power supply node and a ground node and which outputs a first monitor voltage,
- a second line potential monitoring circuit which includes a second voltage dividing circuit connected between a power supply node and a ground node and which outputs a second monitor voltage, and
- a comparison circuit which compares the first monitor voltage with the second monitor voltage;

a pulse signal generation circuit which outputs a first pulse signal in response to the detection results output from said line potential detection circuit; and a power-on reset circuit which has a setting circuit which brings a power-on reset signal to a set level in response to the first pulse signal and which produces the power-on reset signal upon sensing a rise in the potential of the power supply, wherein said setting circuit is connected between a power-on reset signal output node and a predetermined node which is imparted with a potential corresponding to a set level of the power-on reset signal, and said setting circuit includes a transistor which is brought into conduction in response to the first pulse signal.

5. A semiconductor device comprising:

internal circuits which are initialized in response to a power-on reset signal; and a power-on reset circuit including
- a line potential detection circuit which detects a rise in a potential of a power supply in response to first and second monitor voltages output respectively in response to the rise in the potential of the power supply;
- a pulse signal generation circuit which produces pulse signals in response to first and second detection results output from said line potential detection circuit;
- a setting circuit which sets the power-on reset signal to a set level in response to the pulse signal; and
- a power-on reset signal waveform generation circuit which produces the power-on reset signal by sensing a rise in the potential of the power supply, wherein said internal circuits and said power-on reset circuit are integrated into a single chip, said setting circuit is connected between a power-on reset signal output node and a predetermined node which is imparted with a potential corresponding to the set level of the power-on reset signal, and said setting circuit includes a transistor which is brought into conduction in response to the pulse signals.

* * * * *